(12) United States Patent
Tsunekawa et al.

(10) Patent No.: US 6,720,036 B2
(45) Date of Patent: Apr. 13, 2004

(54) METHOD OF PRODUCTION OF SPIN VALVE TYPE GIANT MAGNETORESISTIVE THIN FILM

(75) Inventors: Koji Tsunekawa, Hachioji (JP); Daisuke Nakajima, Tachikawa (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 10/237,716

(22) Filed: Sep. 10, 2002

(65) Prior Publication Data

US 2003/0049389 A1 Mar. 13, 2003

(30) Foreign Application Priority Data

Sep. 13, 2001 (JP) ........................................ 2001-278723

(51) Int. Cl.⁷ ................................................ H05H 1/00
(52) U.S. Cl. ...................... 427/535; 427/58; 427/123; 427/130; 427/131; 427/132; 427/331; 427/402; 427/404; 427/569
(58) Field of Search ................... 427/535, 58, 123, 427/130, 131, 132, 331, 402, 404, 569

(56) References Cited

U.S. PATENT DOCUMENTS 6,495,275 B2 * 12/2002 Kamiguchi et al. ......... 428/692

* cited by examiner

*Primary Examiner*—Bernard Pianalto
(74) *Attorney, Agent, or Firm*—Oliff & Berridge, PLC

(57) ABSTRACT

A production method of the present invention is a method of producing a spin valve type giant magnetoresistive thin film. In this production method, a buffer layer, an antiferromagnetic layer, a fixed magnetization layer, a nonmagnetic conductive layer, a free magnetization layer, and a protective layer are consecutively stacked on a substrate. Furter, plasma treatment is performed on predetermined stacked interfaces in the spin valve type giant magnetoresistive thin film to reduce the interlayer coupling magnetic field acting between the fixed magnetization layer and the free magnetization layer and to obtain a high MR ratio. The above production method can achieve both of the high MR ratio and low interlayer coupling magnetic field (Hin) in the thin film produced.

31 Claims, 18 Drawing Sheets

METHOD OF PRODUCTION OF SPIN VALVE TYPE GIANT MAGNETORESISTIVE THIN FILM

BACKGROUND OF THE INVENTION

1. Field of the Invention

The present invention relates to a method of production of a spin valve type giant magnetoresistive thin film, and more particularly, relates to a method of production of a high performance spin valve type giant magnetoresistive thin film suitable for a magnetic recording head of a hard disk drive.

2. Description of the Related Art

A spin valve type giant magnetoresistive thin film used for a magnetic recording head of a hard disk drive has a multilayer film structure comprised of a plurality of layers (or thin films) including an antiferromagnetic layer, a fixed magnetization layer, a nonmagnetic conductive layer, and a free magnetization layer. In the multilayer film structure of the spin valve type giant magnetoresistive thin film, the nonmagnetic conductive layer is formed between the fixed magnetization layer and the free magnetization layer so that the two are isolated by the nonmagnetic conductive layer. Further, since the antiferromagnetic layer is made to adjoin the fixed magnetization layer, the magnetic moment of the fixed magnetization layer is fixed in one direction by the exchange coupling with the antiferromagnetic layer. On the other hand, the magnetic moment of the free magnetization layer is freely rotated in accordance with the external magnetic field.

The spin valve type giant magnetoresistive thin film generates the so-called "giant magnetoresistive effect", or the change of the electrical resistance due to the relative angle formed by the magnetic moment of the fixed magnetization layer and the magnetic moment of the free magnetization layer. The rate of change of the electrical resistance due to the giant magnetoresistive effect is called the "magnetoresistive ratio" (MR ratio). The MR ratio of a spin valve type giant magnetoresistive thin film is far higher than that of a conventional anisotropic magnetoresistive thin film.

There are three types of spin valve type giant magnetoresistive thin films. The first type, as shown in FIG. 19, is a so-called "bottom type" comprised, from a substrate 111 side, of a buffer layer 112, an antiferromagnetic layer 113, a fixed magnetization layer 114, a nonmagnetic conductive layer 115, a free magnetization layer 116, and a protective layer 117 stacked consecutively in that order. The second type, as shown in FIG. 20, is a so-called "top type" comprised, from a substrate 111 side, of a buffer layer 112, a free magnetization layer 116, a nonmagnetic conductive layer 115, a fixed magnetization layer 114, an antiferromagnetic layer 113, and a protective layer 117 stacked consecutively in that order. The third type, as shown in FIG. 21, is a so-called "dual type" comprised, from a substrate 111 side, of a buffer layer 112, a first antiferromagnetic layer 113A, a first fixed magnetization layer 114A, a first nonmagnetic conductive layer 115A, a free magnetization layer 116, a second nonmagnetic conductive layer 115B, a second fixed magnetization layer 114B, a second antiferromagnetic layer 113B, and a protective layer 117 stacked consecutively in that order.

In the above three types of spin valve type giant magnetoresistive thin films, in the past there have been proposed thin films replacing the single layers of the fixed magnetization layers 114, 114A, and 114B with synthtic ferrimagnet structures comprised of fixed magnetization layer elements, nonmagnetic layers, and fixed magnetization layer elements (U.S. Pat. No. 5,465,185). Further, the free magnetization layer 116 also comes in single layer structures and multilayer structures. In free magnetization layers and fixed magnetization layers of multilayer structures, all the layers are magnetic films, but sometimes different magnetic films are stacked or a sandwich structure interposing a nonmagnetic film therebetween is used.

The giant magnetoresistive effect of the above spin valve type giant magnetoresistive thin film is due to spin-dependent scattering of conductive electrons at the stacked interfaces of multilayer films. Therefore, to obtain a high MR ratio, cleanliness or flatness of the interfaces becomes important in the process of production of the spin valve film. Therefore, in the spin valve type giant magnetoresistive thin film, to achieve the cleanliness or flatness of the interfaces, the films are often formed continuously in the same vacuum chamber so that the intervals between formations of one layer and another become as short as possible.

Techniques for forming a film in vacuum include magnetron sputtering, ion beam sputtering, electron cyclotron resonance (ECR) sputtering, facing target sputtering, high frequency sputtering, electron beam evaporation, resistance heating evaporation, molecular beam epitaxy (MBE), etc.

To obtain a high MR ratio, the thickness of the nonmagnetic conductive layer 115 should be small so as to suppress the flow of conductive electrons not contributing to the giant magnetoresistive effect (shunt effect). If the thickness of the nonmagnetic conductive layer 115 is made small, however, the fixed magnetization layer 114 and the free magnetization layer 116 will end up coupling ferromagnetically through the nonmagnetic conductive layer 115. The interlayer coupling magnetic field (Hin) between the fixed magnetization layer and the free magnetization layer should be small for practical use of the magnetic recording head of a hard disk drive. A field of a value in the range of −10 to +10 Oe is preferable. In the past, to reduce the interlayer coupling magnetic field, the thickness of the nonmagnetic conductive layer 115 was set to a thick 2.5 to 3.5 nm.

Further, in the related art, the technique of reducing the ferromagnetic coupling occurring between the fixed magnetization layer and the free magnetization layer by inserting a nano oxide layer (NOL) of a size of not more than 1 nm into the fixed magnetization layer in the bottom type of spin valve film (Y. Kamiguchi et al.; *Digests of INTERMAG '99*, DB-01) has been proposed. As a result, a relatively small interlayer coupling magnetic field is obtained and a high MR ratio is obtained even with a thin (2 to 2.5 nm) nonmagnetic conductive layer.

That is, in the conventional spin valve type giant magnetoresistive thin film, the thickness of the nonmagnetic conductive layer was set thick (2.5 to 3.5 nm) to reduce the interlayer coupling magnetic field, but the problem arose of a flow of conductive electrons not contributing to the giant magnetoresistive effect (shunt effect) and the MR ratio ending up being reduced. Further, in the process of production of the above nano oxide layer, an oxidation step becomes necessary in the middle of formation of the fixed magnetization layer. An oxidation step is complicated and is poor in reproducibility.

SUMMARY OF THE INVENTION

An object of the present invention is to provide a method of production of a spin valve type giant magnetoresistive thin film able to maintain a low interlayer coupling magnetic field and obtain a high MR ratio without the use of an oxidation step even when the nonmagnetic conductive layer is thin.

The method of production of the spin valve type giant magnetoresistive thin film according to the present invention is configured as follows in order to achieve the above object.

According to a first aspect of the present invention, there is provided a method of production of a spin valve type giant magnetoresistive thin film comprised of a buffer layer deposited on a substrate, a multilayer part comprised of a nonmagnetic conductive layer, a fixed magnetization layer and a free magnetization layer sandwiching this, and an antiferromagnetic layer formed adjoining the fixed magnetization layer, and a protective layer deposited at a topmost position, wherein at least one location in a plurality of interfaces formed between the nonmagnetic conductive layer and the buffer layer is treated by plasma. In the method of production of this spin valve type giant magnetoresistive thin film, a plurality of interfaces formed below the nonmagnetic conductive layer are suitably treated by plasma so as to enhance the flatness and cleanliness of the layers and thereby enable the high MR ratio and low interlayer coupling magnetic field (Hin).

Preferably, at the multilayer part, the fixed magnetization layer is formed at the substrate side, the free magnetization layer is formed at the protective layer side, the fixed magnetization layer and/or the free magnetization layer is comprised of a single layer or a plurality of layers, and at least one location in the plurality of interfaces formed between the nonmagnetic conductive layer and the buffer layer is treated by plasma. This method is a method of production of a bottom type of spin valve type giant magnetoresistive thin film.

Alternatively, at the multilayer part, the free magnetization layer is formed at the substrate side, the fixed magnetization layer is formed at the protective layer side, the fixed magnetization layer and/or the free magnetization layer is comprised of a single layer or a plurality of layers, and at least one location in any plurality of interfaces formed between the nonmagnetic conductive layer and the buffer layer and any plurality of interfaces in the fixed magnetization layer is treated by plasma. This method is a method of production of a top type of spin valve type giant magnetoresistive thin film.

Alternatively, at the multilayer part, the fixed magnetization layer includes a bottom fixed magnetization layer and a top fixed magnetization layer, the nonmagnetic conductive layer includes a bottom nonmagnetic conductive layer and a top nonmagnetic conductive layer, a five-layer structure is formed based on the bottom fixed magnetization layer and free magnetization layer sandwiching the bottom nonmagnetic conductive layer and the free magnetization layer and top fixed magnetization layer sandwiching the top nonmagnetic conductive layer, at least one layer of the bottom fixed magnetization layer, the top fixed magnetization layer, and the free magnetization layer is comprised of a single layer or a plurality of layers, and at least one location in any plurality of interfaces formed between the bottom nonmagnetic conductive layer and the buffer layer and any plurality of interfaces between the top nonmagnetic conductive layer and free magnetization layer is treated by plasma. This method is a method of production of a dual type of spin valve type giant magnetoresistive thin film.

According to a second aspect of the invention, there is provided a method of production of a bottom type of spin valve type giant magnetoresistive thin film comprised of a buffer layer, an antiferromagnetic layer, a fixed magnetization layer, a nonmagnetic conductive layer, a free magnetization layer, and a protective layer consecutively stacked in that order on a substrate, wherein at least one location in the interface between the buffer layer and the antiferromagnetic layer, the interface between the antiferromagnetic layer and the fixed magnetization layer, and the interface between the fixed magnetization layer and the nonmagnetic conductive layer is treated by plasma.

Preferably, the fixed magnetization layer is a synthtic ferrimagnet type fixed magnetization layer having a three-layer structure of a first fixed magnetization layer element and a second fixed magnetization layer element isolated by a nonmagnetic layer, and at least one location in the interface between the antiferromagnetic layer and first fixed magnetization layer element, the interface between the first fixed magnetization layer element and nonmagnetic layer, the interface between the nonmagnetic layer and the second fixed magnetization layer element, and the interface between the second fixed magnetization layer element and the nonmagnetic conductive layer is treated by plasma.

According to a third aspect of the invention, there is provided a method of production of a top type of spin valve type giant magnetoresistive thin film comprised of a buffer layer, a free magnetization layer, a nonmagnetic conductive layer, a fixed magnetization layer, an antiferromagnetic layer, and a protective layer consecutively stacked in that order on a substrate, wherein at least one location in the interface between the buffer layer and the free magnetization layer and the interface between the free magnetization layer and the nonmagnetic conductive layer is treated by plasma.

Preferably, the fixed magnetization layer is a synthtic ferrimagnet type fixed magnetization layer having a three-layer structure of a first fixed magnetization layer element and a second fixed magnetization layer element isolated by a nonmagnetic layer, and at least one location in the interface between the first fixed magnetization layer element and the nonmagnetic layer and the interface between the nonmagnetic layer and the second fixed magnetization layer element is treated by plasma.

According to a fourth aspect of the invention, there is provided a method of production of a dual type of spin valve type giant magnetoresistive thin film comprised of a buffer layer, a first antiferromagnetic layer, a first fixed magnetization layer, a first nonmagnetic conductive layer, a free magnetization layer, a second nonmagnetic conductive layer, a second fixed magnetization layer, a second antiferromagnetic layer, and a protective layer consecutively stacked in that order on a substrate, wherein at least one location in the interface between the buffer layer and the first antiferromagnetic layer, the interface between the first antiferromagnetic layer and the first fixed magnetization layer, the interface between the first fixed magnetization layer and the first nonmagnetic conductive layer, and the interface between the free magnetization layer and the second nonmagnetic conductive layer is treated by plasma.

Preferably, the first fixed magnetization layer is a first synthtic ferrimagnet structure comprised of a three-layer structure of a first fixed magnetization layer element, a first nonmagnetic layer, and a second fixed magnetization layer element; the second fixed magnetization layer is a second synthtic ferrimagnet structure comprised of a three-layer structure of a third fixed magnetization layer element, second nonmagnetic layer, and fourth fixed magnetization layer element; and at least one location in the interface between the first antiferromagnetic layer and first fixed magnetization layer element, the interface between the first fixed magnetization layer element and first magnetic layer, the interface between the first nonmagnetic layer and second fixed magnetization layer element, the interface between the second fixed magnetization layer element and first nonmagnetic conductive layer, the interface between the third fixed magnetization layer element and second nonmagnetic layer, and the interface between the second nonmagnetic layer and fourth fixed magnetization layer element is treated by plasma.

In each of the above aspects of the invention, preferably the buffer layer is a multilayer film comprised of at least two types of layers, and at least one location in any plurality of interfaces existing in the buffer layer is treated by plasma.

In each of the above aspects of the invention, preferably the plasma treatment uses plasma using a 13.56 MHz RF wave in a gas atmosphere of any of 0.01 to 100 Pa low pressure inert gas of Ar, Kr, Xe, Ne, or gas resembling the same and the electrode structure is a type of parallel plate and capacitively-coupled.

In each of the above aspects of the invention, preferably, in the electrode structure, a substrate to be treated by plasma is arranged on an electrode provided with the RF wave, the power by the RF wave is not more than 0.5 W/cm$^2$ per unit area, and a bias voltage applied to the substrate is in a range of less than 0V and at least −300V. Further, in each of the above aspects of the invention, preferably the treatment time of the plasma treatment is a time not more than one minute.

In each of the above aspects of the invention, preferably the plasma treatment is performed using ion bombardment (ion beam irradiation) based on an ion irradiation structure.

According to the method of production of a spin valve type giant magnetoresistive thin film according to the present invention, the formation of the spin valve film for forming the multilayer structure is temporarily interrupted during the formation, interfaces are treated by the ion bombardment, preferably plasma treatment, then the formation of the film is resumed. With this method of production, the plasma treatment does not necessarily have to be performed in a film forming chamber. It may also be performed after moving to an adjoining vacuum chamber of another vacuum chamber through a vacuum transport chamber etc.

Further, according to the method of production of the present invention, regardless of the structure of the spin valve film such as the bottom type, top type, or dual type, when using a Cu layer for the nonmagnetic conductive layer and setting the thickness of the Cu layer to 2.1 nm, the interfaces for plasma treatment etc. are suitably selected in accordance with the bottom type, top type, or dual type of spin valve film structure so that the interlayer coupling magnetic field (Hin) between the fixed magnetization layer and the free magnetization layer through the Cu layer becomes the smallest and the MR ratio becomes the largest. Further, the interruption of the film formation by the plasma treatment is not necessarily limited to one instance. It may be performed a plurality of times in accordance with need.

Further, according to the method of production of the present invention, depending on the material used for the layer to be treated by plasma, the conditions (RF power, treatment time, pressure of Ar etc., etc.) are changed so that the interlayer coupling magnetic field Hin becomes smaller and the MR ratio becomes larger. Further, in the method of production according to the present invention, no process using oxygen or oxidation step is used at all.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1:
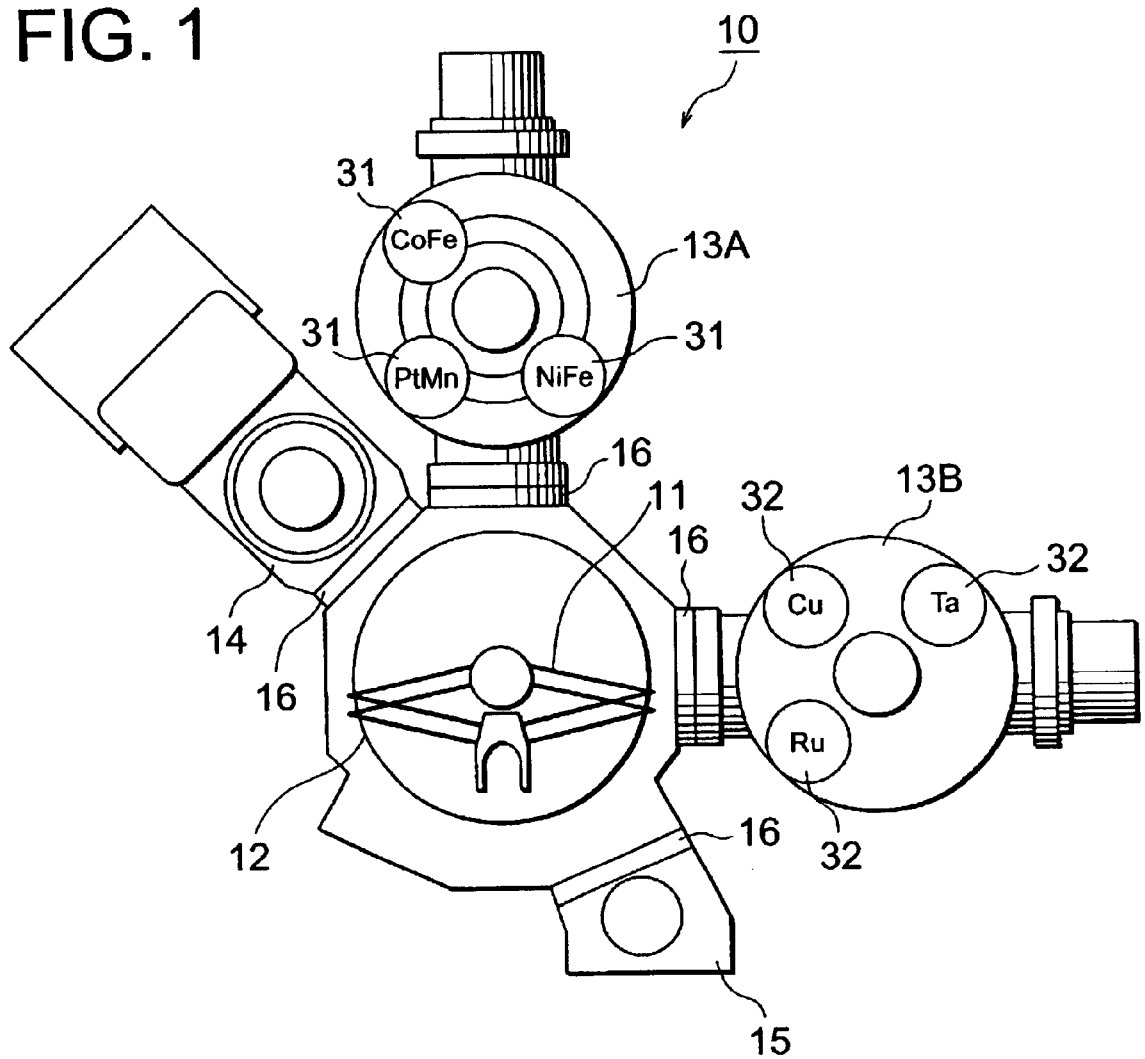
FIG. 1 is a plan view of a film forming system for working the method of production of a spin valve type giant magnetoresistive thin film according to the present invention.

Preferred embodiments of the present invention will be described in detail below while referring to the attached figures. FIG. 1 is a view of the configuration of a film forming system used for working the method of production of a spin valve type giant magnetoresistive thin film according to the present invention. The film forming system 10 is a multichamber type film forming system. The film forming system 10 is comprised of a vacuum transport chamber 12 provided with a substrate transport robot 11, a film forming chamber 13A and film forming chamber 13B connected to the vacuum transport chamber 12, a plasma treatment chamber 14, and a load lock chamber 15. The film forming chambers 13A and 13B are sputtering film forming chambers provided with various types of cathodes. Substrates are moved among the film forming chamber 13A, film forming chamber 13B, plasma treatment chamber 14, and load lock chamber 15 by the substrate transport robot 11 provided in the vacuum transport chamber 12. Gate valves 16 are provided between the film forming chamber 13A, the film forming chamber 13B, the plasma treatment chamber 14, and the load lock chamber 15 and the vacuum transport chamber.

Figure 2:
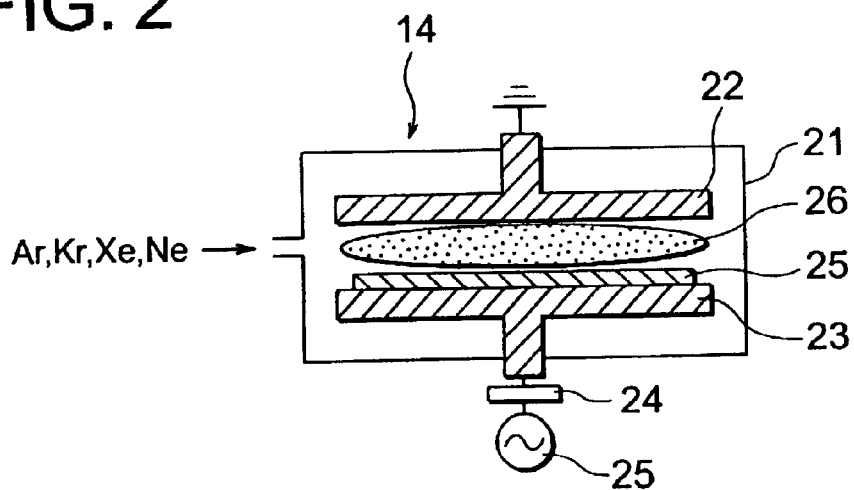
FIG. 2 is a longitudinal sectional view of an internal configuration of a plasma treatment chamber of a film forming system.

The internal structure of the plasma treatment chamber 14 is shown in FIG. 2. The plasma treatment chamber 14 is formed in a vacuum chamber 21. A top electrode 22 and bottom electrode 23 are provided in the vacuum chamber 21. The top electrode 22 is grounded, while the bottom electrode 23 is connected to an RF power source (high frequency power source) 25 through a matching box 24. A substrate 25 is carried on the bottom electrode 23. Plasma 26 is generated between the top electrode 22 and the bottom electrode 23 in the state with the plasma generation conditions established.

As a typical example of the operation of the plasma treatment chamber 14, Ar gas of 0.075 Pa is introduced inside the vacuum chamber 21, an RF power of 15W (0.029 W/cm$^2$) is supplied to the bottom electrode 23 to cause the generation of plasma, and plasma treatment is performed under conditions given a substrate bias voltage (Vdc) in the range of smaller than 0V and at least −300V. The upper limit of the substrate bias voltage is preferably −2 to −3V. The most preferable voltage is one in the range from −15V to the upper limit of the substrate bias voltage. As the process gas introduced into the vacuum chamber 21, it is also possible to use Kr, Xe, Ne, or another inert gas or a gas resembling the same instead of Ar. The pressure of the process gas in the plasma treatment chamber 14 is set to a low pressure in the range of 0.01 to 100 Pa.

Three types of targets 31 are set in the film forming chamber 13A. These are made of PtMn, CoFe, and NiFe. Further, three types of targets 32 are set in the film forming chamber 13B. These are made of Cu, Ta, and Ru. The substrate transport robot 11 moves the substrate 25 between the film forming chambers 13A and 13B and the plasma treatment chamber 13, whereby a multilayer film having a desired multilayer structure is formed.

Figure 3:
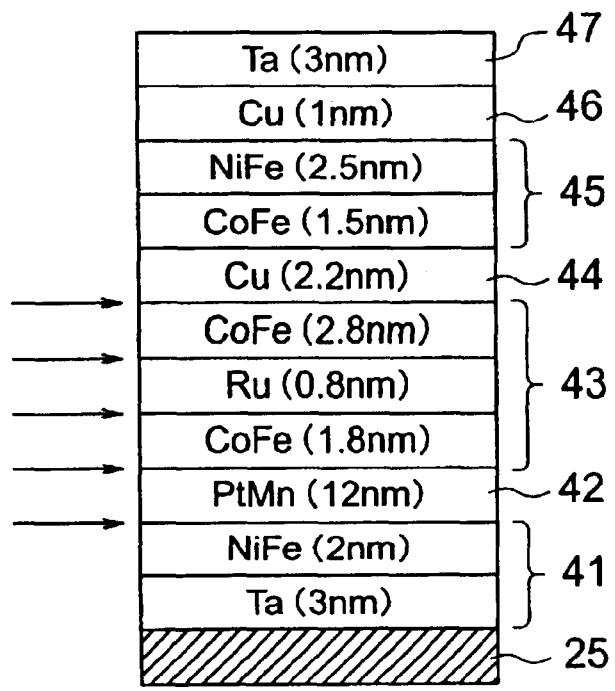
FIG. 3 is a view of the multilayer structure of a bottom type of a spin valve type giant magnetoresistive thin film of an example of a multilayer film.

As one example, FIG. 3 shows a multilayer structure of a bottom type of spin valve type giant magnetoresistive thin film. According to this multilayer structure, Ta (3 nm)/NiFe (2 nm)/PtMn (12 nm)/CoFe (1.8 nm)/Ru (0.8 nm)/CoFe (2.8 nm)/Cu (2.2 nm)/CoFe (1.5 nm)/NiFe (2.5 nm)/Cu (1 nm)/Ta (3 nm) are consecutively stacked in that order from the substrate 25 side. The numerical values given in parentheses in the layers are the thicknesses of the layers in units of nanometers (nm). In the above multilayer structure, Ta (3 nm) and NiFe (2 nm) are the buffer layers 41, PtMn (12 nm) is the antiferromagnetic layer 42, CoFe (1.8 nm), Ru (0.8 nm), and CoFe (2.8 nm) are the fixed magnetization layers (synthtic ferrimagnet structure) 43, Cu (2.2 nm) is the nonmagnetic conductive layer 44, CoFe (1.5 nm) and NiFe (2.5 nm) are the free magnetization layers 45, Cu (1 nm) is a spin filter 46, and Ta (3 nm) is the protective layer 47. As explained above, to form the bottom type of spin valve film, first Ta (3 nm) is formed in the film forming chamber 13B, NiFe (2 nm)/PtMn (12 nm)/CoFe (1.8 nm) is formed in the film forming chamber 13A, Ru (0.8 nm) is formed in the film forming chamber 13B, CoFe (2.8 nm) is formed in the film forming chamber 13A, Cu (2.2 nm) is formed in the film forming chamber 13B, CoFe (1.5 nm)/NiFe (2.5 nm) is formed in the film forming chamber 13A, and finally Cu (1 nm)/Ta (3 nm) is formed in the film forming chamber 13B.

Plasma treatment is suitably performed in the film forming steps of the above bottom type of spin valve type giant magnetoresistive thin film. When performing plasma treatment, the film formation is temporarily interrupted at the desired interface, the substrate 25 is transported to the plasma treatment chamber 14, and plasma treatment is performed there.

When plasma treating for example the Ru (0.8 nm)/CoFe (2.8 nm) interface in the film forming steps of the above bottom type spin valve film, the operation is as follows: First, Ta (3 nm) is formed in the film forming chamber 13B, NiFe (2 nm)/PtMn (12 nm)/CoFe (1.8 nm) is formed in the film forming chamber 13A, Ru (0.8 nm) is formed in the film forming chamber 13B, the substrate is transported to the plasma treatment chamber 14 where the interface is plasma treated based on the above treatment conditions, CoFe (2.8 nm) is formed in the film forming chamber 13A, Cu (2.2 nm) is formed in the film forming chamber 13B, CoFe (1.5 nm)/NiFe (2.5 nm) is formed in the film forming chamber 13A, and finally Cu (1 nm)/Ta (3 nm) is formed in the film forming chamber 13B.

In the explanation of the above embodiment, the explanation was given of plasma treatment using as an example treatment of predetermined interfaces, but this plasma treatment is a broad concept and includes treatment of the interfaces by ion bombardment by an inert gas and treatment by neutral particles, radicals, atoms, and other particles. A similar effect is obtained even if changing to ion beam etching using an ion gun.

Next, detailed embodiments of the method of production of a spin valve type giant magnetoresistive thin film according to the present invention will be explained while referring to FIG. 1 to FIG. 5 and the later explained graphs. In the explanations of the embodiments, the interfaces to be plasma treated are clarified.

Figure 6:
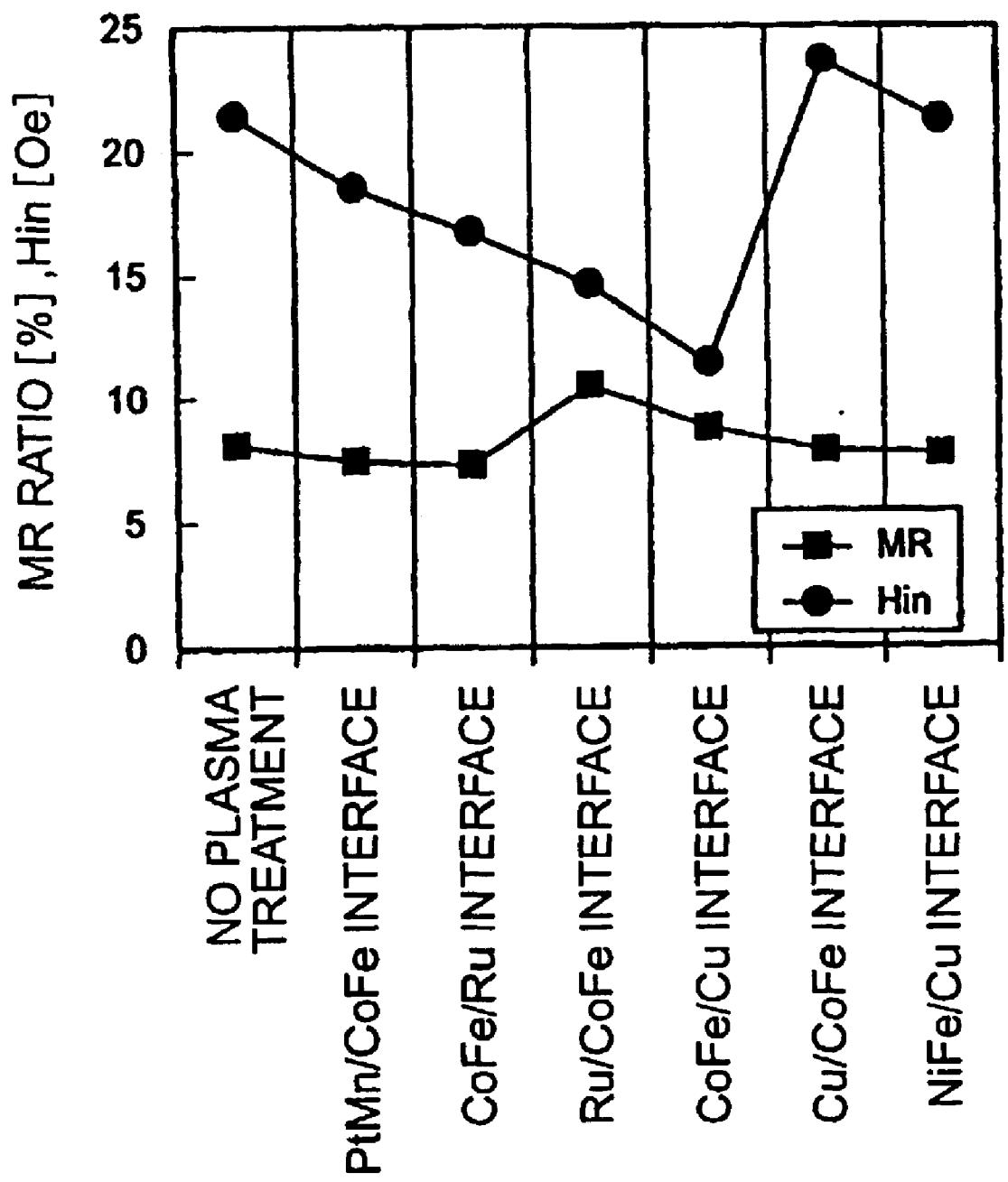
FIG. 6 is a graph showing a first embodiment of the present invention and showing a dependency on interfaces for plasma treatment in a bottom type of spin valve type giant magnetoresistive thin film.

[First Embodiment]: The first embodiment relates to the method of production of the bottom type of spin valve type giant magnetoresistive thin film shown in FIG. 3. That is, it is an example of plasma treatment in the middle of film formation in a method of production of a bottom type spin valve film having a multilayer structure from the substrate 25 side of Ta (3 nm)/NiFe (2 nm)/PtMn (12 nm)/CoFe (1.8 nm)/Ru (0.8 nm)/CoFe (2.8 nm)/Cu (2.2 nm)/CoFe (1.5 nm)/NiFe (2.5 nm)/Cu (1 nm)/Ta (3 nm). FIG. 6 is a graph showing the change of the MR ratio and Hin ratio where the abscissa shows the case of "No plasma treatment" and the cases of plasma treatment at the "PtMn/CoFe interface", "CoFe/Ru interface", "Ru/CoFe interface", and "CoFe/Cu interface" and the ordinate shows the MR ratio and interlayer coupling magnetic field Hin. In this embodiment, when the plasma treatment time was standardized to 15 seconds and the interfaces for plasma treatment were changed, a drop in the interlayer coupling magnetic field Hin could be realized by plasma treatment of the PtMn/CoFe interface, CoFe/Ru interface, Ru/CoFe interface, and CoFe/Cu interface. With simultaneous plasma treatment of the Ru/CoFe interface and CoFe/Cu interface, an improvement in the MR ratio could also be achieved. Therefore, in the film configuration of the present embodiment, it is preferable to plasma treat the Ru/CoFe interface or the CoFe/Cu interface, and it is more preferable to plasma treat both of the Ru/CoFe interface and CoFe/Cu interface.

In a bottom type spin valve film having a multilayer structure of Ta (3 nm)/NiFe (2 nm)/PtMn (12 nm)/CoFe (1.8 nm)/Ru (0.8 nm)/CoFe (2.8 nm)/Cu (2.2 nm)/CoFe (1.5 nm)/NiFe (2.5 nm)/Cu (1 nm)/Ta (3 nm), a drop in the interlayer coupling magnetic field Hin and an improvement in the MR ratio can be expected by plasma treatment at the interface of the NiFe (2 nm)/PtMn (12 nm), the interface of the PtMn (12 nm)/CoFe (1.8 nm), the interface of the CoFe (1.8 nm)//Ru (0.8 nm), the interface of the Ru (0.8 nm)/CoFe (2.8 nm), and the interface of the CoFe (2.8 nm)/Cu (2.2 nm). In FIG. 3, the interfaces designated by the rightward pointing arrows are the interfaces for which plasma treatment is preferable.

Figure 4:
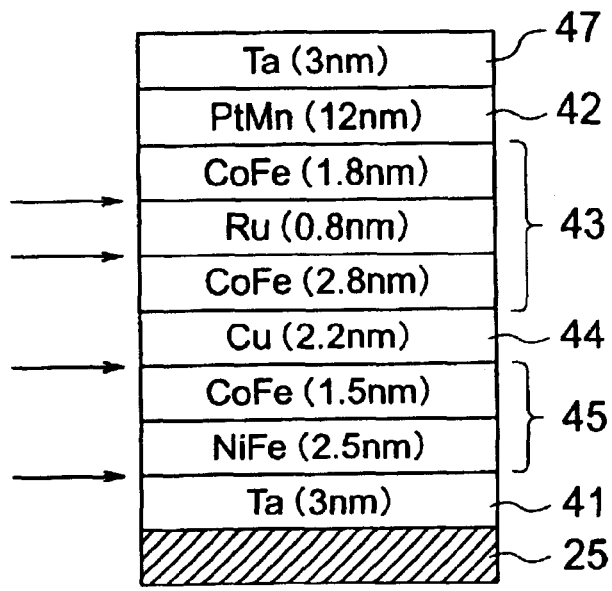
FIG. 4 is a view of the multilayer structure of a top type of a spin valve type giant magnetoresistive thin film of an example of a multilayer film.
Figure 7:
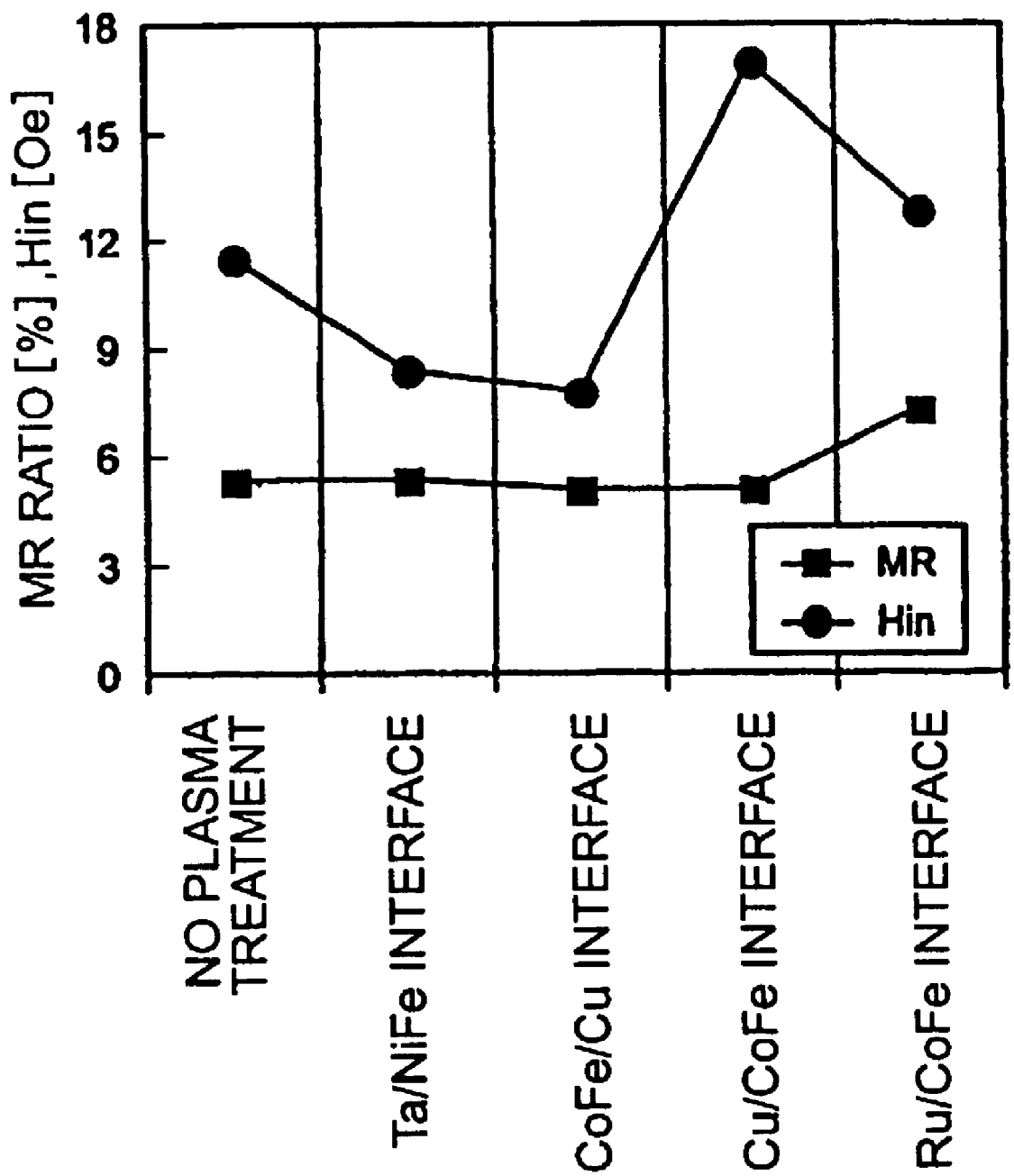
FIG. 7 is a graph showing a second embodiment of the present invention and showing a dependency on interfaces for plasma treatment in a top type of spin valve type giant magnetoresistive thin film.

[Second Embodiment]: The second embodiment relates to a method of production of the top type of spin valve type giant magnetoresistive thin film shown in FIG. 4. That is, it is an example of plasma treatment in the middle of film formation in a method of production of a top type spin valve film having a multilayer structure from the substrate 25 side of Ta (3 nm)/NiFe (2.5 nm)/CoFe (1.5 nm)/Cu (2.2 nm)/CoFe (2.8 nm)/Ru (0.8 nm)/CoFe (1.8 nm)/PtMn (12 nm)/Ta (3 nm). In this multilayer structure, the Ta (3 nm) is the buffer layer 41, the NiFe (2.5 nm)/CoFe (1.5 nm) is the free magnetization layer 45, the Cu (2.2 nm) is the nonmagnetic conductive layer 44, the CoFe (2.8 nm)/Ru (0.8 nm)/CoFe (1.8 nm) is the fixed magnetization layer (synthetic ferrimagnet structure) 43, the PtMn (12 nm) is the antiferromagnetic layer 42, and the Ta (3 nm) is the protective layer 47. FIG. 7 is a graph showing the change of the MR ratio and interlayer coupling magnetic field Hin where the abscissa shows the case of "No plasma treatment" and the cases of plasma treatment at the "Ta/NiFe interface", "CoFe/Ru interface", "Cu/CoFe interface", and "Ru/CoFe interface" and the ordinate shows the MR ratio and interlayer coupling magnetic field Hin. In this embodiment as well, when the plasma treatment time was standardized to 15 seconds and the interfaces for plasma treatment were changed, as shown in FIG. 7, a drop in the interlayer coupling magnetic field Hin could be realized by plasma treatment of the Ta/NiFe interface and CoFe/Cu interface. Further, with plasma treatment of the Ru/CoFe interface, an improvement in the MR ratio was achieved. Therefore, in the film configuration of the present embodiment, it is preferable to plasma treat at least one location in the Ta/NiFe interface, CoFe/Cu interface, and Ru/CoFe interface and it is more preferable to plasma treat both of the CoFe/Cu interface and Ru/CoFe interface. Further, a similar effect can be expected even if plasma treating the CoFe/Ru interface. In FIG. 4, the interfaces designated by the rightward pointing arrows are the interfaces for which plasma treatment is preferable.

Figure 8:
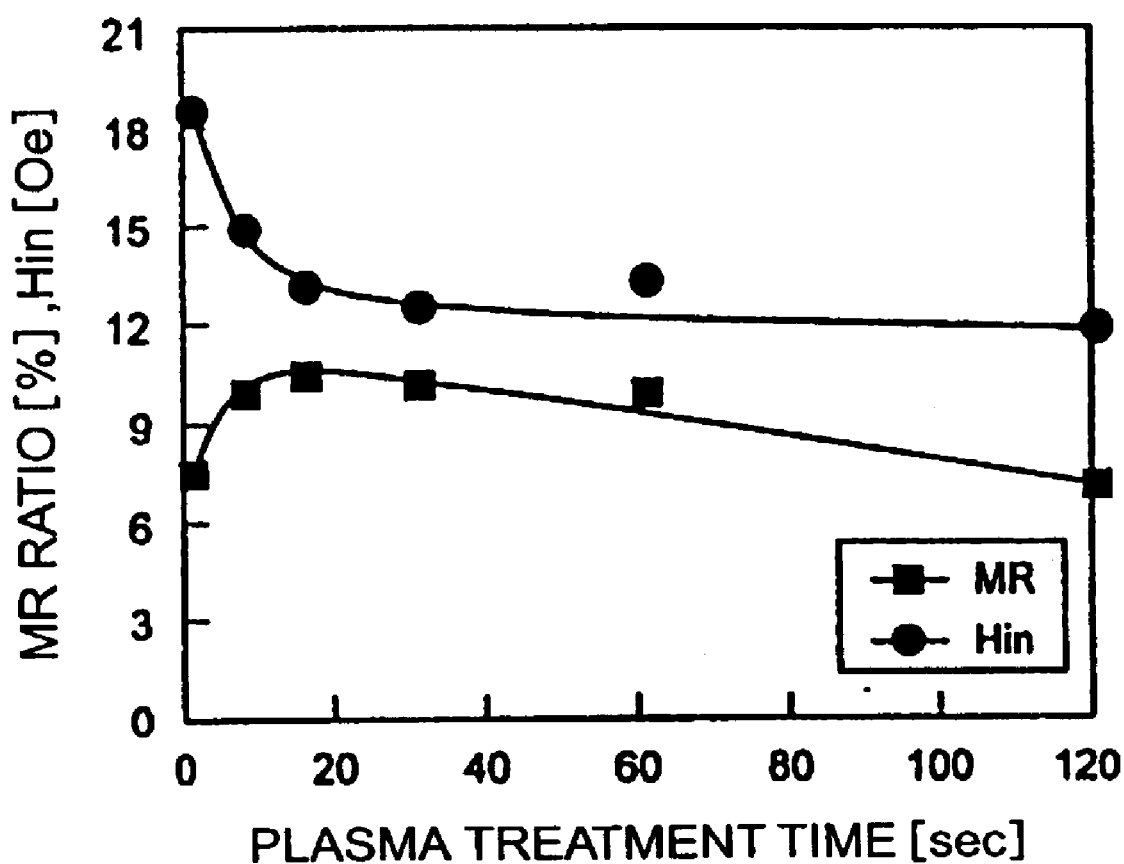
FIG. 8 is a graph showing a third embodiment of the present invention and showing a dependency on the plasma treatment time of an Ru/CoFe interface in a bottom type of spin valve type giant magnetoresistive thin film.

[Third Embodiment]: In the third embodiment, an explanation is given of an example of change of the plasma treatment time in a method of production of the above bottom type of spin valve type giant magnetoresistive thin film shown in FIG. 3. FIG. 8 is a graph showing the change of the MR ratio and interlayer coupling magnetic field Hin when the abscissa shows the plasma treatment time (seconds) and the ordinate shows the MR ratio and interlayer coupling magnetic field Hin. According to FIG. 8, it is learned that in a bottom type spin valve film, if the treatment time of the plasma treatment of the Ru/CoFe interface is changed, the plasma treatment time of the Ru/CoFe interface is preferably a time in the range of 10 to 30 seconds giving the highest MR ratio.

Figure 5:
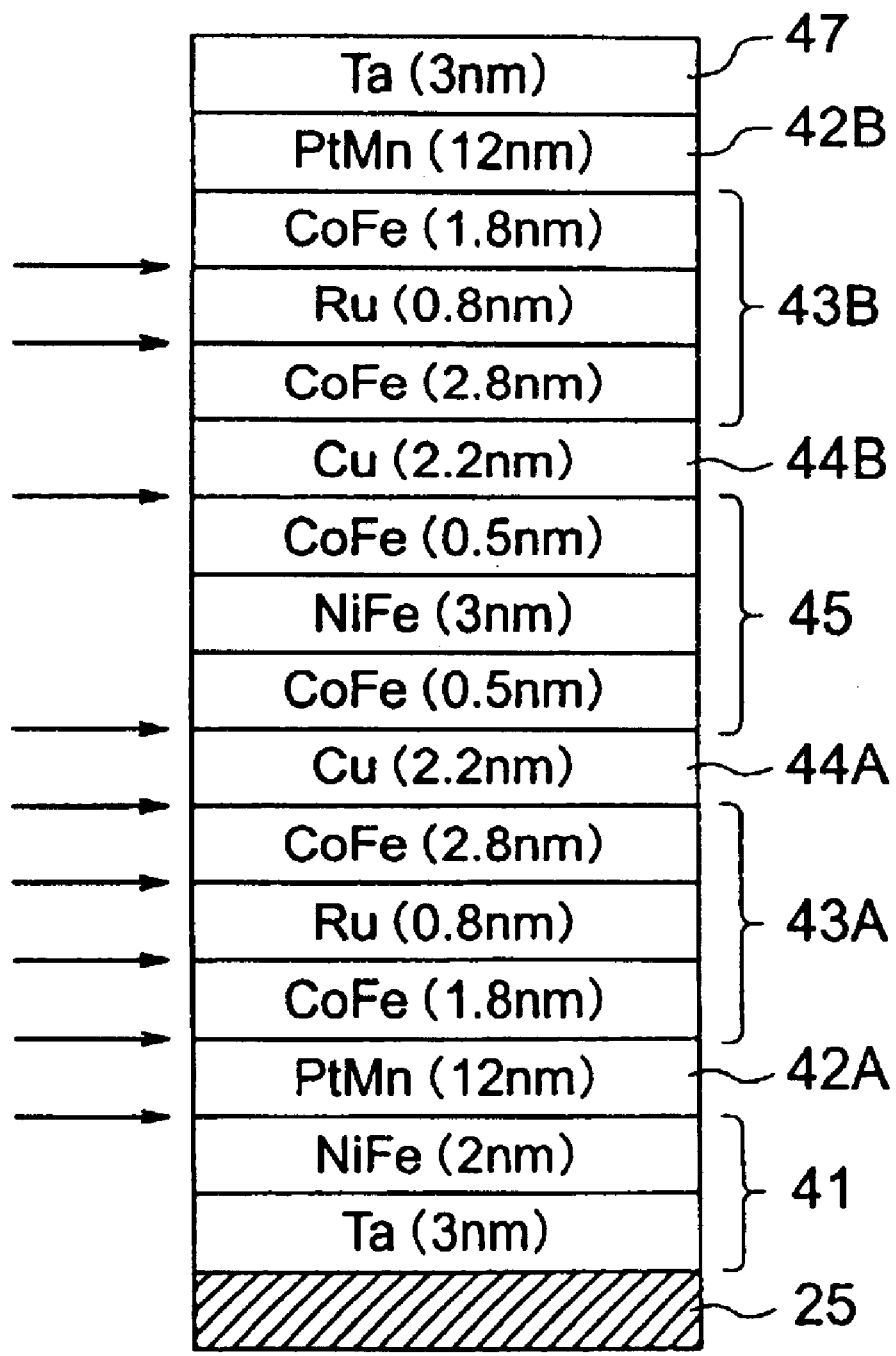
FIG. 5 is a view of the multilayer structure of a dual type of a spin valve type giant magnetoresistive thin film of an example of a multilayer film.
Figure 9:
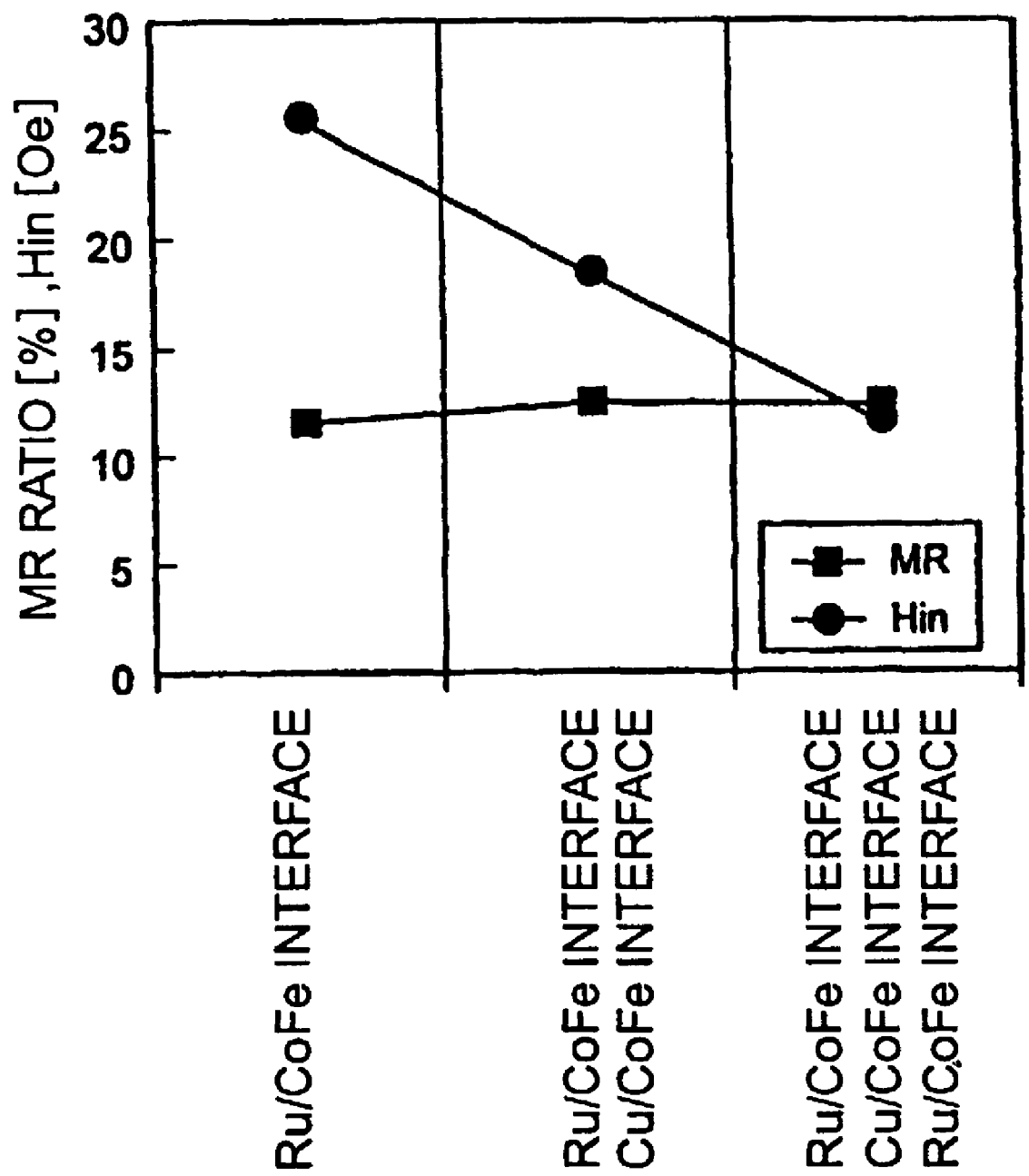
FIG. 9 is a graph showing a fourth embodiment of the present invention and showing a dependency on interfaces of a dual type of spin valve type giant magnetoresistive thin film.

[Fourth Embodiment]: The fourth embodiment relates to a method of production of a dual type of spin valve type giant magnetoresistive thin film shown in FIG. 5. That is, it is an example of plasma treatment in the middle of film formation in a method of production of a dual type spin valve film having a multilayer structure from the substrate 25 side of Ta (3 nm)/NiFe (2 nm)/PtMn (12 nm)/CoFe (1.8 nm)/Ru (0.8 nm)/CoFe (2.8 nm)/Cu (2.2 nm)/CoFe (0.5 nm)/NiFe (3 nm)/CoFe (0.5 nm)/Cu (2.2 nm)/CoFe (2.8 nm)/Ru (0.8 nm)/CoFe (1.8 nm)/PtMn (12 nm)/Ta (3 nm). In this multilayer structure, the Ta (3 nm)/NiFe (2 nm) is the buffer layer 41, the PtMn (12 nm) is the first antiferromagnetic layer 42A, the CoFe (1.8 nm)/Ru (0.8 nm)/CoFe (2.8 nm) is the first fixed magnetization layer (first synthtic ferrimagnet structure) 43A, the Cu (2.2 nm) is the first nonmagnetic conductive layer 44A, the CoFe (0.5 nm)/NiFe (3 nm)/CoFe (0.5 nm) is the free magnetization layer 45, the Cu (2.2 nm) is the second nonmagnetic conductive layer 44B, the CoFe (2.8 nm)/Ru (0.8 nm)/CoFe (1.8 nm) is the second fixed magnetization layer (second synthtic ferrimagnet structure) 43B, the PtMn (12 nm) is the second antiferromagnetic layer 42B, and the Ta (3 nm) is the protective layer 47. FIG. 9 is a graph showing the change of the MR ratio and Hin where the abscissa shows the case of plasma treatment at each of the "Ru/CoFe interface", "Ru/CoFe interface and Cu/CoFe interface", and "Ru/CoFe interface, Cu/CoFe interface, and Ru/CoFe interface" and the ordinate shows the MR ratio and interlayer coupling magnetic field Hin. In this embodiment, when the time of plasma treatment was standardized at 15 seconds and the interfaces for plasma treatment were changed, a drop in the interlayer coupling magnetic field Hin and an improvement in the MR ratio could be realized in the case of plasma treatment of the three interfaces of the Ru/CoFe interface, Cu/CoFe interface, and Ru/CoFe interface. Therefore, in the film configuration of the present embodiment, while it is preferable to plasma treat any of the three interfaces of the Ru/CoFe interface, Cu/CoFe interface, and Ru/CoFe interface, to further reduce the interlayer coupling magnetic field Hin and improve the MR ratio, it is preferable to plasma treat all of the three interfaces of the Ru/CoFe interface, Cu/CoFe interface, and Ru/CoFe interface. In FIG. 5, the interfaces designated by the rightward pointing arrows are the interfaces for which plasma treatment is preferred.

Figure 10:
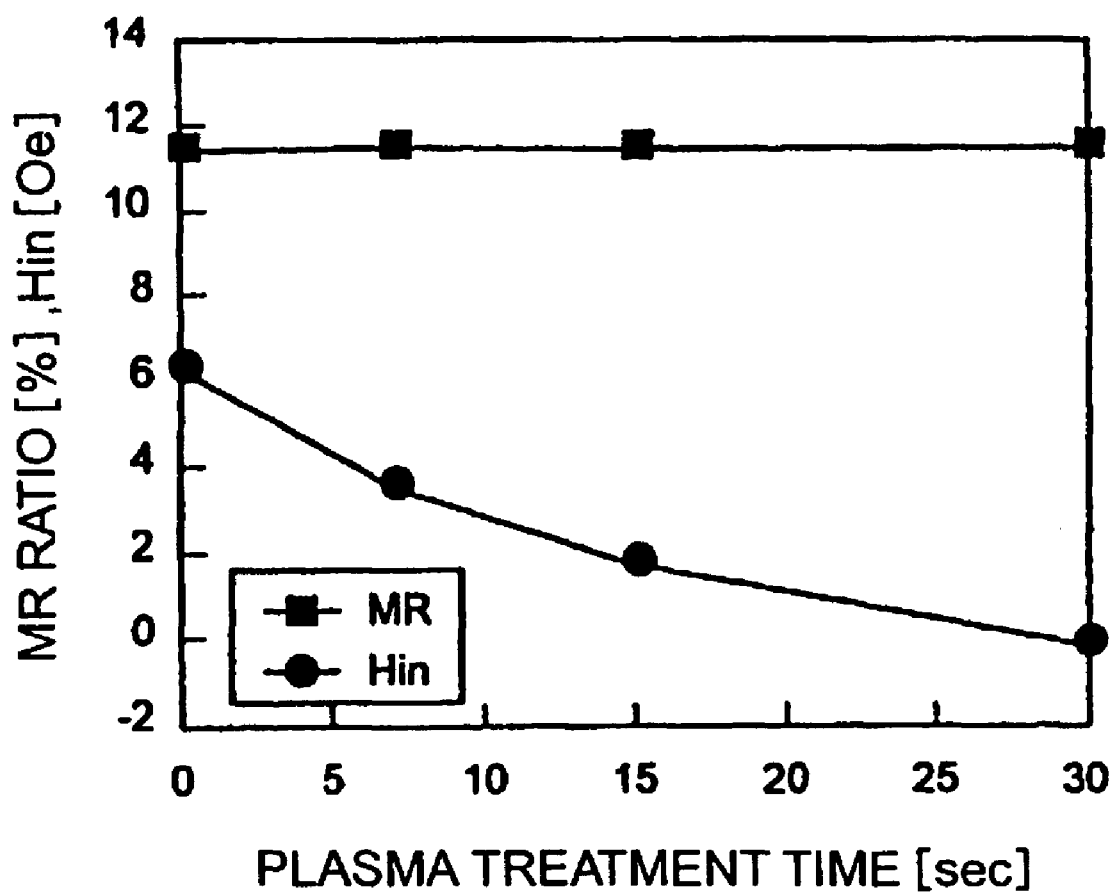
FIG. 10 is a graph showing a fifth embodiment of the present invention and showing a dependency on the plasma treatment time of a CoFe/Cu interface in a bottom type of spin valve type giant magnetoresistive thin film.

[Fifth Embodiment]: In the fifth embodiment, the explanation will be given of an example of changing the plasma treatment time in the method of production of the above bottom type of spin valve type giant magnetoresistive thin film shown in FIG. 3. FIG. 10 is a graph showing the change of the MR ratio and the interlayer coupling magnetic field Hin where the abscissa shows the plasma treatment time (sec) and the ordinate shows the MR ratio and interlayer coupling magnetic field Hin. According to FIG. 10, the plasma treatment time of the Ru/CoFe interface in the bottom type spin valve film was standardized at 15 seconds and the plasma treatment time of the CoFe/Cu interface was changed. According to this embodiment, it is learned that the plasma treatment time of the CoFe/Cu interface is preferably the 30 seconds giving the lowest interlayer coupling magnetic field Hin.

Figure 11:
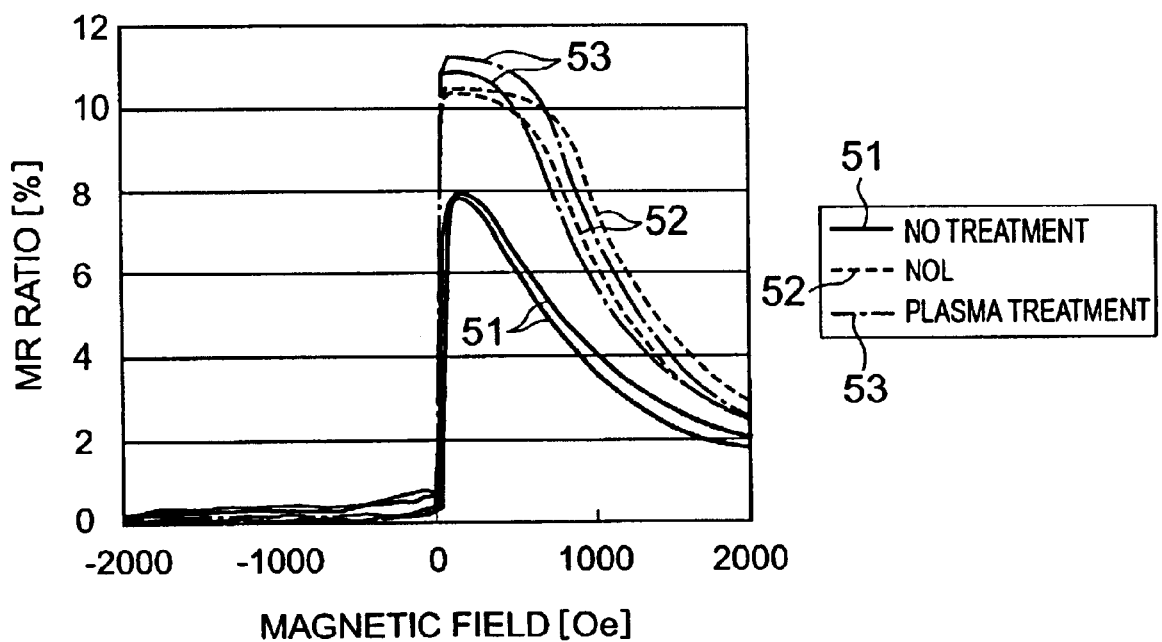
FIG. 11 is a graph showing a sixth embodiment of the present invention and showing a comparison of the MR curve in the case of a standard type of a bottom type of spin valve type giant magnetoresistive thin film, an NOL, and plasma treatment.

[Sixth Embodiment]: The sixth embodiment shows a comparison of the MR curves of the spin valve film in the case of no plasma treatment, the case of sandwiching an NOL of CoFe of a thickness of not more than 1 nm between the Ru (0.8 nm) and CoFe (2.8 nm), and the case of plasma treating the Ru (0.8 nm)/CoFe (2.8 nm) interface for 15 seconds in the production of a multilayer structure of the above bottom type of spin valve type giant magnetoresistive thin film shown in FIG. 3. In FIG. 11, the abscissa shows the strength of the magnetic field, while the ordinate shows the MR ratio. Shown are an MR curve 51 of the case of no plasma treatment, an MR curve 52 of the case of an NOL sandwiched between the Ru (0.8 nm) and CoFe (2.8 nm), and an MR curve 53 in the case of plasma treating the Ru (0.8 nm)/CoFe (2.8 nm) interface for 15 seconds. According to FIG. 11, by inserting the NOL in the same film structure, the MR ratio is improved from 7.9% to 10.4%, while when performing plasma treatment, 11.2% was obtained. A similar effect is obtained even if forming a 1 to 4 nm CoFe layer after insertion of the NOL, then performing the plasma treatment. Further, while the coercive force (Hc) of the free magnetization layer comprised of the CoFe (1.5 nm)/NiFe (2.5 nm) of the spin valve film in the case of no plasma treatment was 0.6 Oe, it was 1.3 Oe in the case of insertion of an NOL and 0.7 Oe in the case of plasma treatment. The smaller the coercive force of the free magnetization layer comprised of a soft magnetic material of CoFe and NiFe the better. The secondary effect was also obtained that the coercive force was not made to deteriorate by the plasma treatment as in this embodiment.

Figure 12:
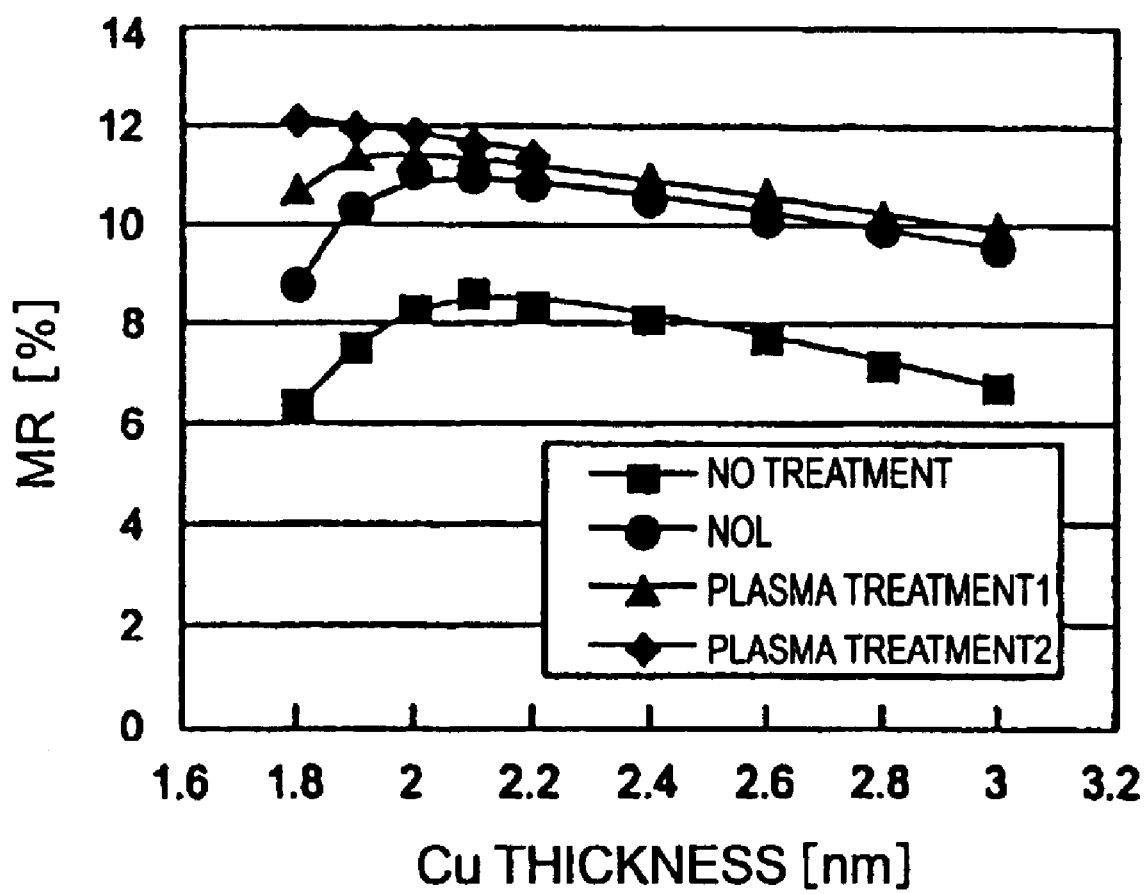
FIG. 12 is a graph showing a seventh embodiment and shows a CU layer thickness dependency of the MR ratio in the case of no plasma treatment in a bottom type of spin valve type giant magnetoresistive thin film, the case of insertion of an NOL, the case of plasma treatment of an Ru/CoFe interface, and the case of plasma treatment of an Ru/CoFe interface and CoFe/Cu interface.
Figure 13:
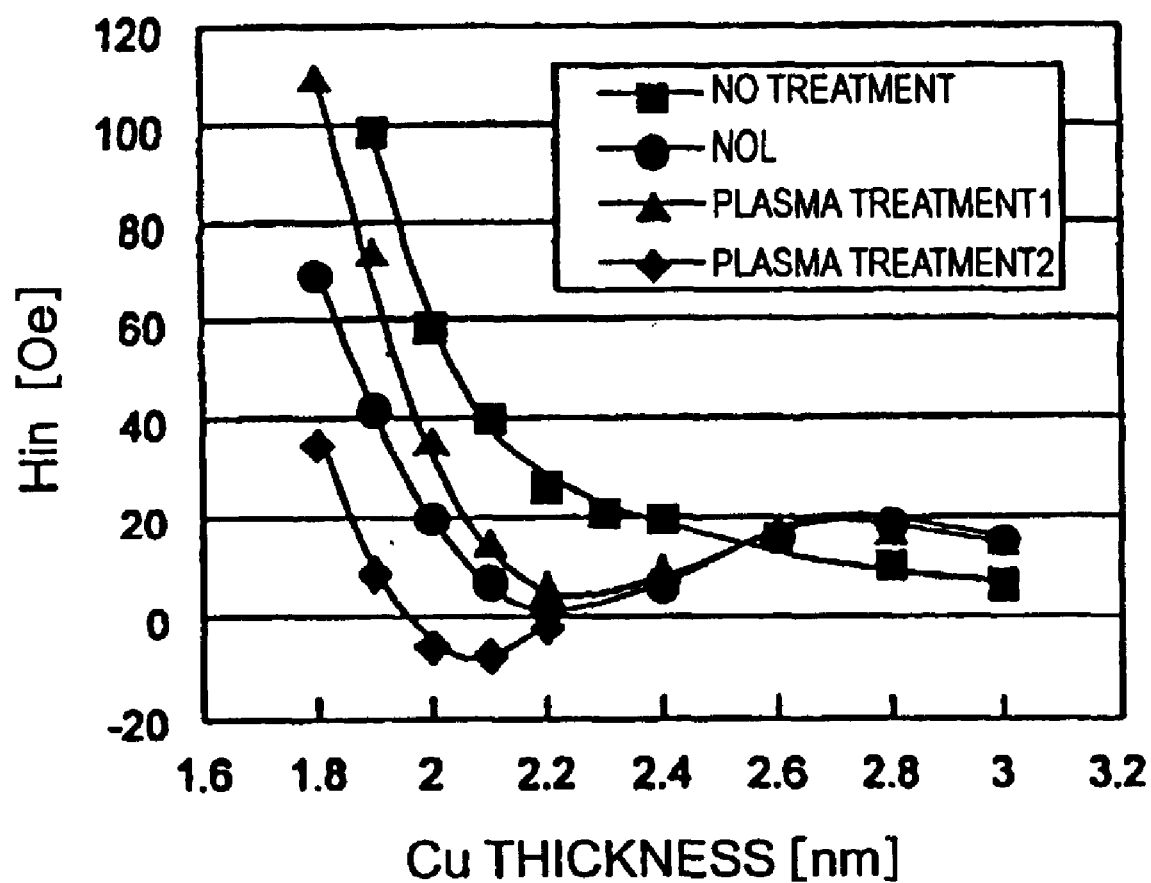
FIG. 13 is a graph showing a seventh embodiment and shows a CU layer thickness dependency of the interlayer coupling magnetic field Hin in the case of no plasma treatment in a bottom type of spin valve type giant magnetoresistive thin film, the case of insertion of an NOL, the case of plasma treatment of an Ru/CoFe interface, and the case of plasma treatment of an Ru/CoFe interface and CoFe/Cu interface.

[Seventh Embodiment]: The seventh embodiment shows the Cu layer thickness dependency of the MR ratio (FIG. 12) and the Cu layer thickness dependency of the interlayer coupling magnetic field Hin (FIG. 13) in the case of no plasma treatment at the above bottom type of spin valve film, in the case of insertion of an NOL, in the case of plasma treatment of the Ru/CoFe interface, and in the case of plasma treatment of the Ru/CoFe interface and CoFe/Cu interface in the above sixth embodiment. In FIG. 12, the abscissa shows the Cu layer thickness (nm) and the ordinate shows the MR ratio (%), while in FIG. 13, the abscissa shows the Cu layer thickness (nm) and the ordinate shows the interlayer coupling magnetic field Hin (Oe). As shown in FIG. 12 and FIG. 13, in the case of no plasma treatment, the interlayer coupling magnetic field Hin increases as the Cu layer thickness becomes smaller. When the Cu layer thickness becomes less than 2.1 nm, a drop in the MR ratio occurs, but if plasma treating only the Ru/CoFe interface and if plasma treating the Ru/CoFe interface and CoFe/Cu interface, the interlayer coupling magnetic field Hin vibrates with respect to the Cu layer thickness and a high MR ratio is maintained even if the Cu layer thickness becomes less than 2 nm.

Figure 14:
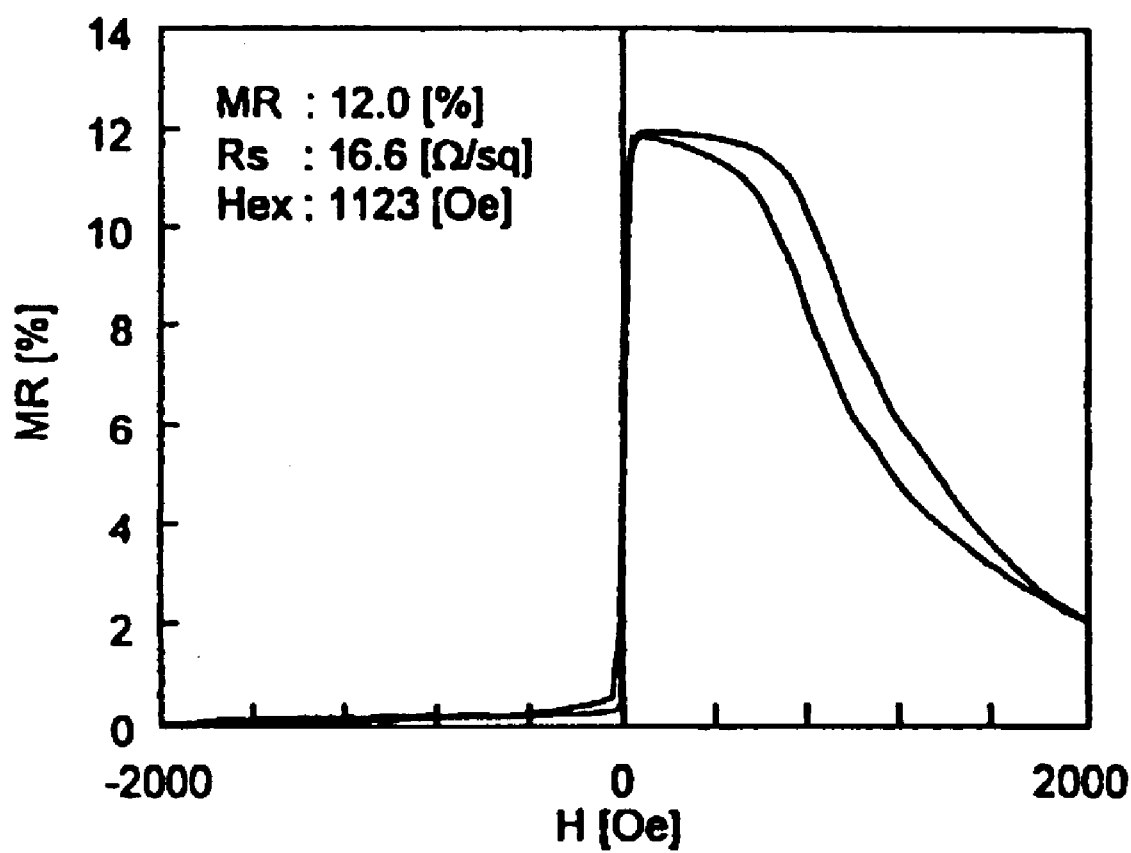
FIG. 14 is a graph showing an eighth embodiment and shows an MR curve major loop in the case of plasma treatment of an Ru/CoFe interface and in the case of plasma treatment of a CoFe/Cu interface in a bottom type of spin valve type giant magnetoresistive thin film.
Figure 15:
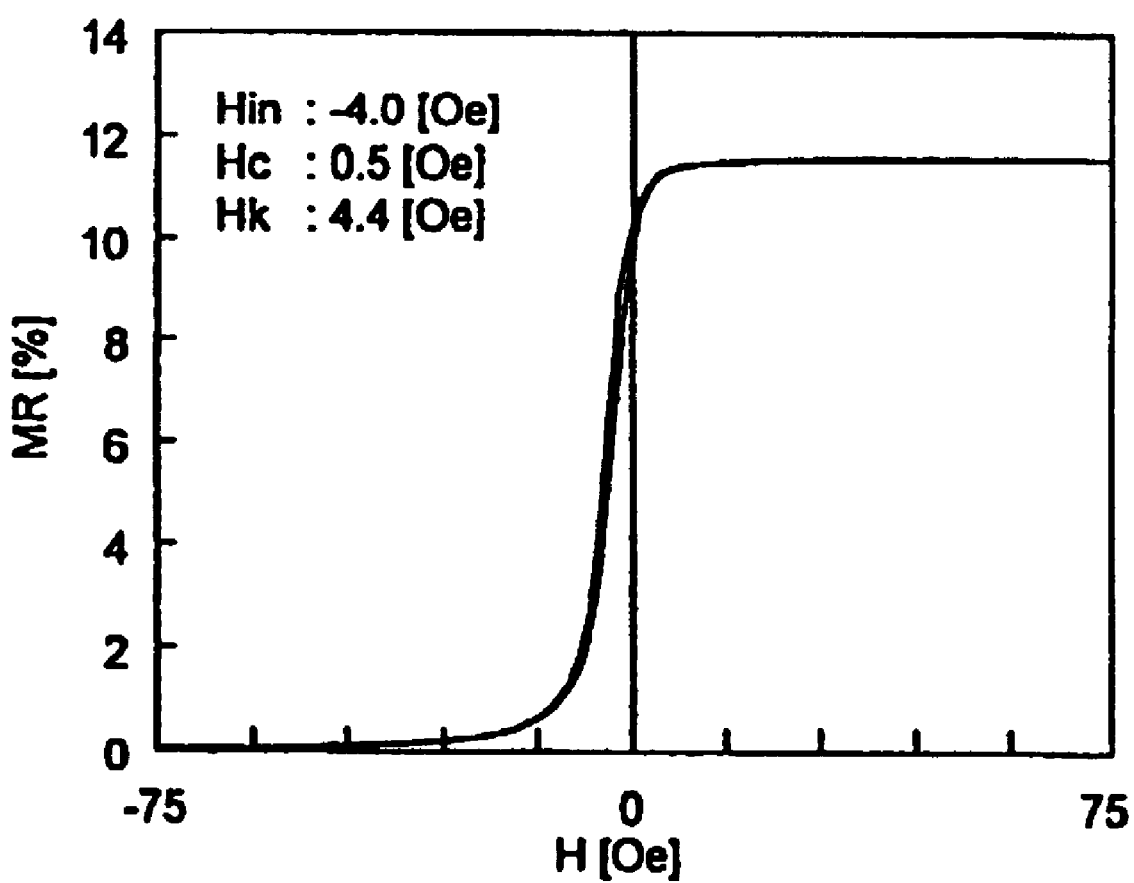
FIG. 15 is a graph showing an eighth embodiment and shows an MR curve minor loop in the case of plasma treatment of an Ru/CoFe interface and in the case of plasma treatment of a CoFe/Cu interface in a bottom type of spin valve type giant magnetoresistive thin film.

[Eighth Embodiment]: The eight embodiment shows an MR curve major loop (FIG. 15) and MR curve minor loop (FIG. 15) in the case of plasma treating the Ru/CoFe interface and the case of plasma treating the CoFe/Cu interface in the above bottom type of spin valve film in the above sixth embodiment. In FIG. 14 and FIG. 15, the abscissas show the H (Oe) and the ordinates show the MR (%). In this embodiment, the example is shown of the Ru/CoFe interface being plasma treated for 15 seconds and the CoFe/Cu interface being plasma treated for 30 seconds. According to this embodiment, a high MR ratio of 12%, a low interlayer coupling magnetic field Hin of −4.0 Oe, and a low coercive force Hc of 0.50 Oe are obtained.

Figure 16:
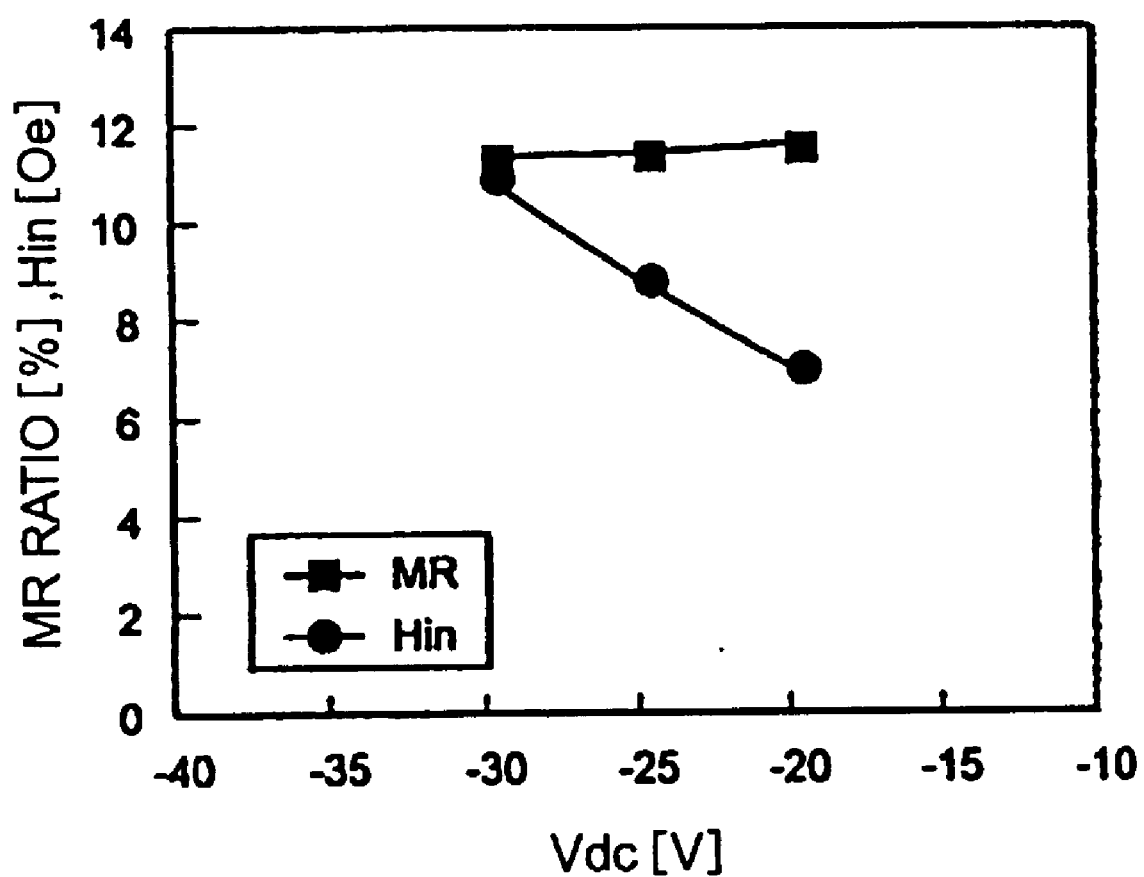
FIG. 16 is a graph showing a ninth embodiment of the present invention and shows a dependency of a plasma condition of bias voltage Vdc to a substrate in plasma treatment of an Ru/CoFe interface in the method of production of a bottom type of spin valve type giant magnetoresistive thin film.

[Ninth Embodiment]: FIG. 16 shows a ninth embodiment of an example of change of the plasma condition of the bias voltage Vdc to the substrate in plasma treatment of the Ru/CoFe interface in the method of production of a bottom type of spin valve type giant magnetoresistive thin film. According to this embodiment, it is learned that the closer to zero a bias voltage applied negatively to the substrate 25, the lower the interlayer coupling magnetic field Hin and higher the MR ratio obtained.

In the above embodiments, similar effects can be achieved even if changing the Cu layer of the spin valve film to an oxide layer of Al (AlOx layer), that is, changing to a so-called "TMR film". A TMR film gives a higher MR ratio than even a giant magnetoresistive thin film, so is a magnetic multilayer film promising for the next generation of magnetic recording heads. It is also considered promising for the next generation of nonvolatile memories.

In the above embodiments, when the synthtic ferrimagnet type fixed magnetization layer is a multilayer film where the nonmagnetic layer sandwiched between one magnetic film and another magnetic film is comprised of at least two types of layers, it is preferable that at least one location in the interfaces existing in the nonmagnetic layer be plasma treated. Further, when the free magnetization layer is a multilayer film comprised of at least two types of layers, it is preferable that at least one location in the interfaces existing in the free magnetization layer be plasma treated. Further, when the antiferromagnetic layer is a multilayer film comprised of at least two types of layers, it is preferable that at least one location in the interfaces existing in the antiferromagnetic layer be plasma treated.

In the above embodiments, in the multichamber type film forming system 10, a plasma treatment chamber 14 was specially provided for the purpose of plasma treatment at a suitable stage in the middle of formation of the multilayer structure of the spin valve type giant magnetoresistive thin film, but the invention is not limited to this. For example, it is possible to provide the parallel plate electrode structure shown in FIG. 2 or provide an ion irradiation structure and perform the plasma treatment in the film formation chamber.

Figure 17:
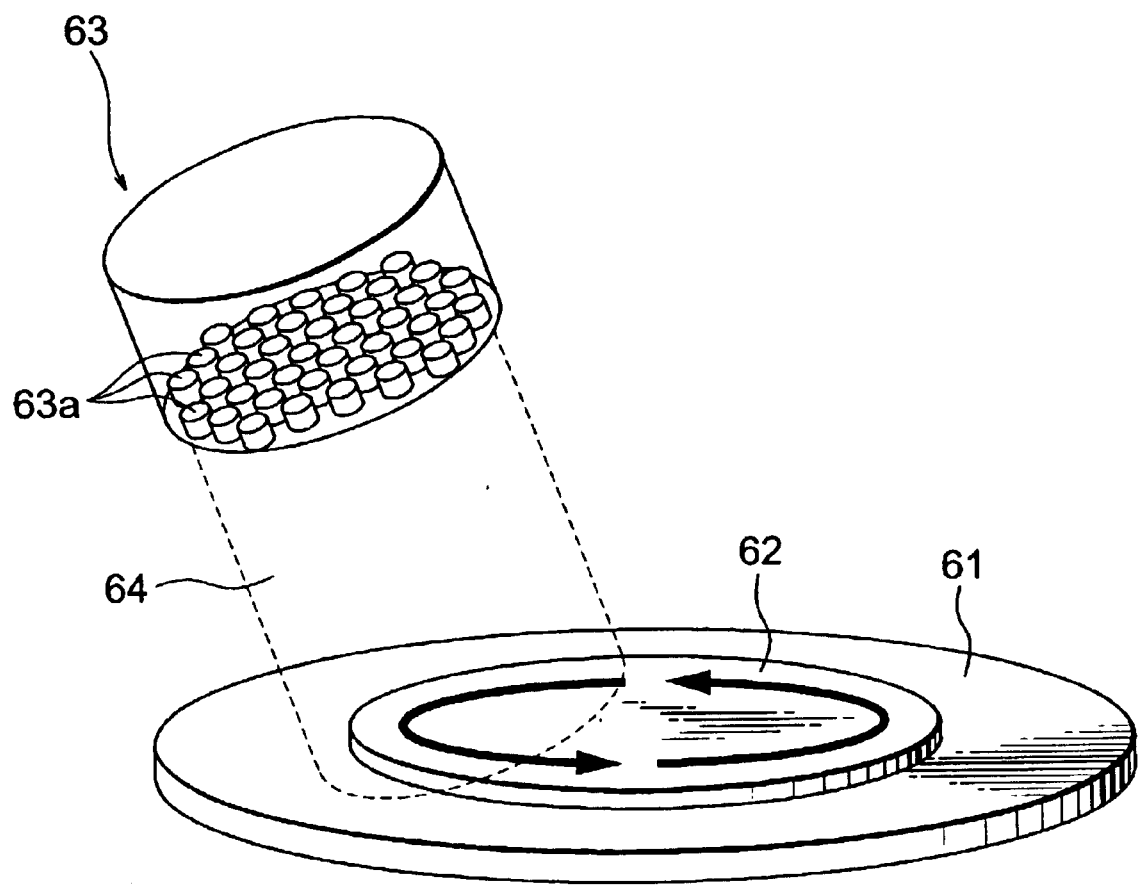
FIG. 17 is a schematic view of the configuration of one example of main parts of the ion irradiation structure provided in the film formation chamber.

One example of principal parts of an ion irradiation structure provided in the film formation chamber is schematically shown in FIG. 17. An ion beam source 63 is placed at a slant above a substrate 62 placed on a substrate holder 61. An ion beam is fired at a slant from the ion beam source 63 to the surface of the substrate 62 at a relatively small angle, whereby the substrate surface is etched. The angle of incidence of the ion beam 64 can be changed in the range of 5° to 30°. The substrate holder 62 is provided to be able to be elevated and rotated. The ion beam source 63 is provided with at least one cell 63a provided on the same plane. Ion beams are emitted from the large number of cells 63a. Any device can be used as the device of a cell generating an ion beam.

Figure 18:
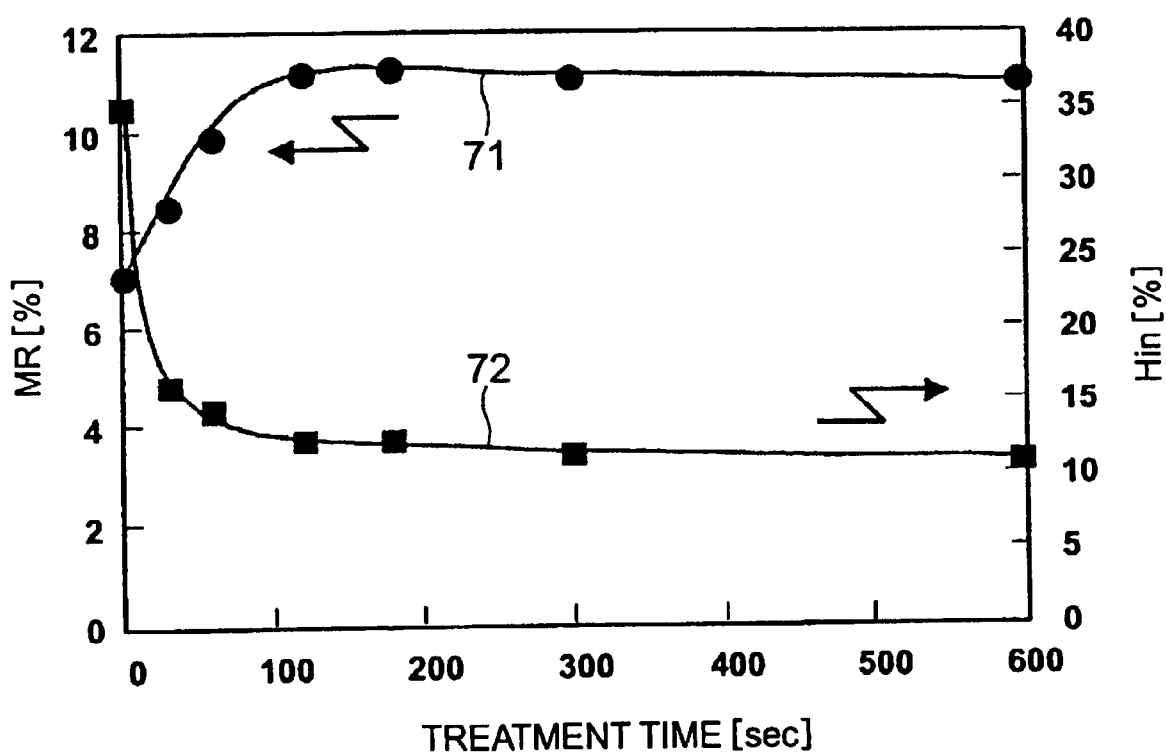
FIG. 18 is a graph of the relationship among treatment time, MR ratio, and interlayer coupling magnetic field Hin in the case of application of ion beam treatment based on an ion irradiation structure to a Ru surface of the spin valve type giant magnetoresistive thin film shown in FIG. 3.
Figure 19:
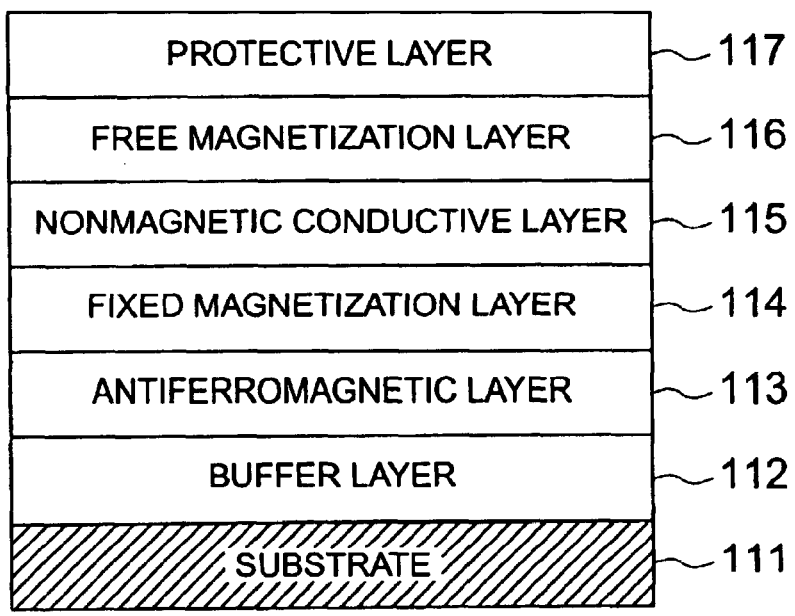
FIG. 19 is a sectional view of an example of a multilayer structure of a bottom type of spin valve type giant magnetoresistive thin film.
Figure 20:
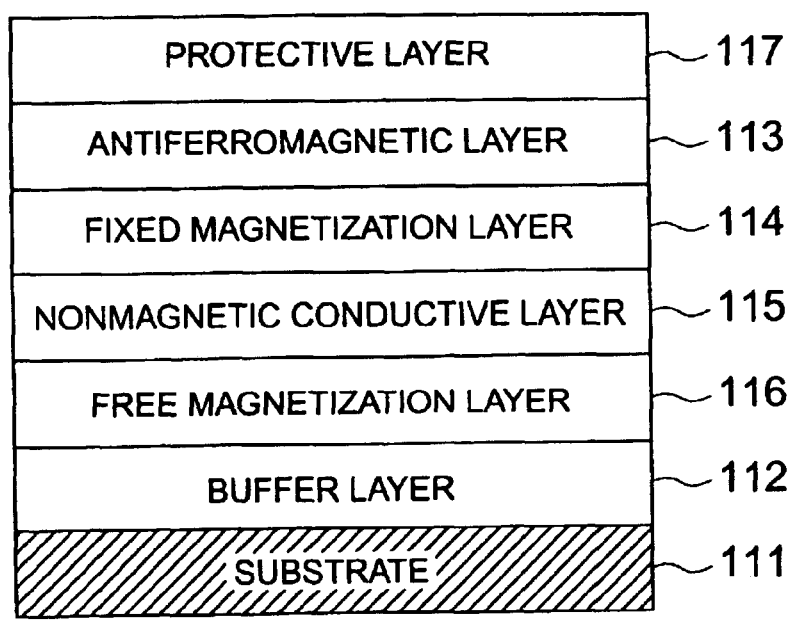
FIG. 20 is a sectional view of an example of a multilayer structure of a top type of spin valve type giant magnetoresistive thin film.
Figure 21:
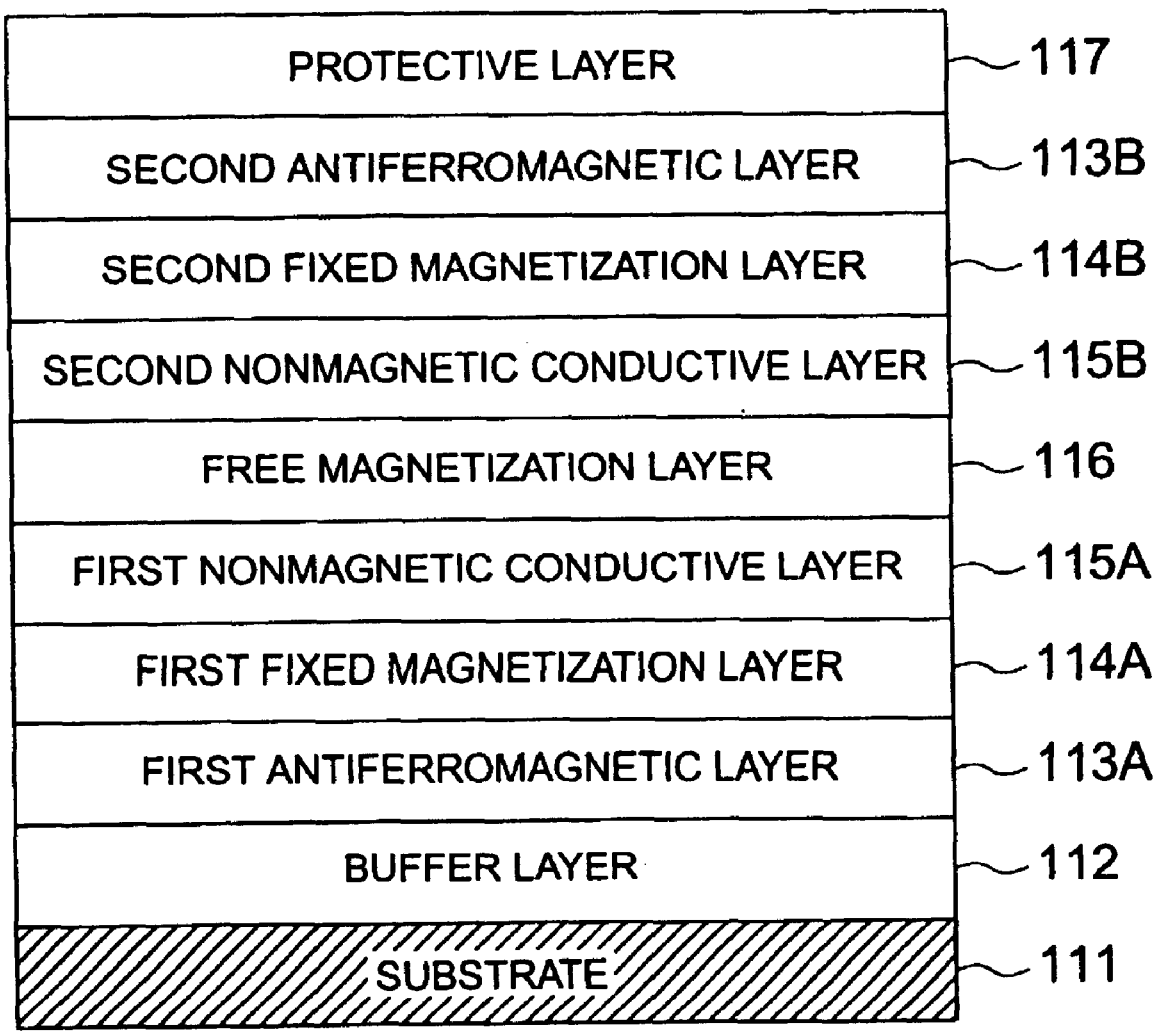
FIG. 21 is a sectional view of an example of a multilayer structure of a dual type of spin valve type giant magnetoresistive thin film.

The relationship between the treatment time and the MR ratio and interlayer coupling magnetic field Hin in the case of applying ion beam processing based on the above ion irradiation structure to the surface of Ru of the GMR film of the film structure shown in FIG. 3 is shown in FIG. 18. The MR ratio increased from 7% to about 11% in a treatment time of 0 to 150 seconds, then was held substantially constant (Characteristic 71). The interlayer coupling magnetic field Hin was reduced from 35% to about 10% in a treatment time 0 to 150 seconds and then was held substantially constant (Characteristic 72). As clear from these characteristics, the above ion beam treatment enables the interlayer coupling magnetic field Hin of the spin valve type giant magnetoresistive thin film to be reduced and the MR ratio to be strengthened.

With the method of production of a spin valve type giant magnetoresistive thin film according to the present invention, by plasma treating predetermined interfaces selected as explained above in the multilayer structure of the spin valve type giant magnetoresistive thin film, the interfaces are flattened and cleaned and thereby a high MR ratio is realized, but of course it is possible to realize the effects of the present invention by plasma treating any one or any combination or all of the interfaces present between the buffer layer and protective film.

In the above explanation, the explanation was given while considering the invention solely from the aspect of a method of production of a spin valve type giant magnetoresistive thin film, but a multilayer film structure itself of a spin valve type giant magnetoresistive thin film produced by the method of production of the present invention also has predetermined interfaces flattened and cleaned by plasma treatment etc. and has an innovative film structure.

According to the present invention, since the film formation of a spin valve type giant magnetoresistive thin film is temporarily interrupted during the film formation and predetermined interfaces plasma treated, the ferromagnetic coupling acting between the fixed magnetization layer and the free magnetization layer sandwiching a nonmagnetic conductive layer between them can be reduced, the interlayer coupling magnetic field Hin between the fixed magnetization layer and the free magnetization layer can be maintained at a magnetic field in the range of −10 to +10 Oe even when the nonmagnetic conductive layer is thin, and a high MR ratio can be obtained. In addition, since no process using oxygen or oxidation step is used at all, it is possible to obtain a high MR ratio stably with a good reproducibility.

The present disclosure relates to subject matter contained in Japanese Patent Application No. 2001-278723, filed on Sep. 13, 2001, the disclosure of which is expressly incorporated herein by reference in its entirety.

What is claimed is:

1. A method of production of a spin valve type giant magnetoresistive thin film comprised of a buffer layer deposited on a substrate, a multilayer part including a nonmagnetic conductive layer, a fixed magnetization layer and a free magnetization layer sandwiching said nonmagnetic conductive layer and an antiferromagnetic layer formed adjoining said fixed magnetization layer, and a protective layer deposited at a topmost position, wherein at least one location in the plurality of interfaces formed between said nonmagnetic conductive layer and said buffer layer is treated by plasma.

2. A method of production of a spin valve type giant magnetoresistive thin film as set forth in claim 1, wherein, at said multilayer part, said fixed magnetization layer is formed at the substrate side, said free magnetization layer is formed at the protective layer side, said fixed magnetization layer and/or said free magnetization layer is comprised of a single layer or a plurality of layers, and at least one location in any plurality of interfaces formed between said nonmagnetic conductive layer and said buffer layer is treated by plasma.

3. A method of production of a spin valve type giant magnetoresistive thin film as set forth in claim 1, wherein, at said multilayer part, said free magnetization layer is formed at the substrate side, said fixed magnetization layer is formed at the protective layer side, said fixed magnetization layer and/or said free magnetization layer is comprised of a single layer or a plurality of layers, and at least one location in any plurality of interfaces formed between said nonmagnetic conductive layer and said buffer layer and any plurality of interfaces in said fixed magnetization layer is treated by plasma.

4. A method of production of a spin valve type giant magnetoresistive thin film as set forth in claim 1, wherein, at the multilayer part, said fixed magnetization layer includes a bottom fixed magnetization layer and a top fixed magnetization layer, said nonmagnetic conductive layer includes a bottom nonmagnetic conductive layer and a top nonmagnetic conductive layer, a five-layer structure is formed based on said bottom fixed magnetization layer and free magnetization layer sandwiching said bottom nonmagnetic conductive layer and said free magnetization layer and top fixed magnetization layer sandwiching said top nonmagnetic conductive layer, at least one layer of said bottom fixed magnetization layer, said top fixed magnetization layer and said free magnetization layer is comprised of a single layer or a plurality of layers, and at least one location in any plurality of interfaces formed between said bottom nonmagnetic conductive layer and said buffer layer and any plurality of interfaces between said top nonmagnetic conductive layer and said free magnetization layer is treated by plasma.

5. A method of production of a spin valve type giant magnetoresistive thin film as set forth in claim 1, wherein said buffer layer is a multilayer film comprised of at least two types of layers, and at least one location in any plurality of interfaces existing in said buffer layer is treated by plasma.

6. A method of production of a spin valve type giant magnetoresistive thin film as set forth in claim 1, wherein said plasma treatment uses plasma using a 13.56 MHz RF wave in a gas atmosphere of any of 0.01 to 100 Pa low pressure inert gas of Ar, Kr, Xe, Ne, or a gas resembling the same and an electrode structure is a type of parallel plate and capacitively-coupled.

7. A method of production of a spin valve type giant magnetoresistive thin film as set forth in claim 6, wherein, in said electrode structure, the substrate to be treated by plasma is arranged on an electrode supplied with said RF wave, the power by said RF wave is not more than 0.5 W/cm² per unit area, and a bias voltage applied to said substrate is in a range of less than 0V and at least −300V.

8. A method of production of a spin valve type giant magnetoresistive thin film as set forth in claim 6, wherein the time of said plasma treatment is not more than one minute.

9. A method of production of a spin valve type giant magnetoresistive thin film as set forth in claim 1, wherein said plasma treatment is performed using ion bombardment based on an ion irradiation structure.

10. A method of production of a bottom type of spin valve type giant magnetoresistive thin film comprised of a buffer layer, an antiferromagnetic layer, a fixed magnetization layer, a nonmagnetic conductive layer, a free magnetization layer, and a protective layer consecutively stacked in that order on a substrate, wherein
at least one location in the interface between said buffer layer and said antiferromagnetic layer, the interface between said antiferromagnetic layer and said fixed magnetization layer, and the interface between said fixed magnetization layer and said nonmagnetic conductive layer is treated by plasma.

11. A method of production of a spin valve type giant magnetoresistive thin film as set forth in claim 10, wherein
said fixed magnetization layer is a synthtic ferrimagnet type fixed magnetization layer having a three-layer structure of a first fixed magnetization layer element and a second fixed magnetization layer element isolated by a nonmagnetic layer, and
at least one location in the interface between said antiferromagnetic layer and said first fixed magnetization layer element, the interface between said first fixed magnetization layer element and said nonmagnetic layer, the interface between said nonmagnetic layer and said second fixed magnetization layer element, and the interface between said second fixed magnetization layer element and said nonmagnetic conductive layer is treated by plasma.

12. A method of production of a spin valve type giant magnetoresistive thin film as set forth in claim 10, wherein said buffer layer is a multilayer film comprised of at least two types of layers and at least one location in any plurality of interfaces existing in said buffer layer is treated by plasma.

13. A method of production of a spin valve type giant magnetoresistive thin film as set forth in claim 10, wherein said plasma treatment uses plasma using a 13.56 MHz RF wave in a gas atmosphere of any of 0.01 to 100 Pa low pressure inert gas of Ar, Kr, Xe, Ne, or a gas resembling the same and an electrode structure is a type of parallel plate and capacitively-coupled.

14. A method of production of a spin valve type giant magnetoresistive thin film as set forth in claim 13, wherein, in said electrode structure, the substrate to be treated by plasma is arranged on an electrode provided with said RF wave, the power by said RF wave is not more than 0.5 W/cm² per unit area, and a bias voltage applied to the substrate is in a range of less than 0V and at least −300V.

15. A method of production of a spin valve type giant magnetoresistive thin film as set forth in claim 13, wherein the time of said plasma treatment is not more than one minute.

16. A method of production of a spin valve type giant magnetoresistive thin film as set forth in claim 10, wherein said plasma treatment is performed using ion bombardment based on an ion irradiation structure.

17. A method of production of a top type of spin valve type giant magnetoresistive thin film comprised of a buffer layer, free magnetization layer, nonmagnetic conductive layer, fixed magnetization layer, antiferromagnetic layer, and protective layer consecutively stacked in that order on a substrate, wherein
at least one location in the interface between said buffer layer and said free magnetization layer and the interface between said free magnetization layer and said nonmagnetic conductive layer is treated by plasma.

18. A method of production of a spin valve type giant magnetoresistive thin film as set forth in claim 17, wherein
said fixed magnetization layer is a synthtic ferrimagnet type fixed magnetization layer having a three-layer structure of a first fixed magnetization layer element and second fixed magnetization layer element isolated by a nonmagnetic layer, and
at least one location in the interface between said first fixed magnetization layer element and said nonmagnetic layer, and the interface between said nonmagnetic layer and said second fixed magnetization layer element is treated by plasma.

19. A method of production of a spin valve type giant magnetoresistive thin film as set forth in claim 17, wherein said buffer layer is a multilayer film comprised of at least two types of layers, and at least one location in any plurality of interfaces existing in said buffer layer is treated by plasma.

20. A method of production of a spin valve type giant magnetoresistive thin film as set forth in claim 17, wherein said plasma treatment uses plasma using a 13.56 MHz RF wave in a gas atmosphere of any of 0.01 to 100 Pa low pressure inert gas of Ar, Kr, Xe, Ne, or a gas resembling the same and an electrode structure is a type of parallel plate and capacitively-coupled.

21. A method of production of a spin valve type giant magnetoresistive thin film as set forth in claim 20, wherein, in said electrode structure, the substrate to be treated by plasma is arranged on an electrode provided with said RF wave, the power by said RF wave is not more than 0.5 W/cm² per unit area, and a bias voltage applied to the substrate is in a range of less than 0V and at least −300V.

22. A method of production of a spin valve type giant magnetoresistive thin film as set forth in claim 20, wherein the time of said plasma treatment is not more than one minute.

23. A method of production of a spin valve type giant magnetoresistive thin film as set forth in claim 17, wherein said plasma treatment is performed using ion bombardment based on an ion irradiation structure.

24. A method of production of a dual type of spin valve type giant magnetoresistive thin film comprised of a buffer layer, a first antiferromagnetic layer, first fixed magnetization layer, first nonmagnetic conductive layer, free magnetization layer, second nonmagnetic conductive layer, second fixed magnetization layer, second antiferromagnetic layer, and protective layer consecutively stacked in that order on a substrate, wherein
at least one location in the interface between said buffer layer and said first antiferromagnetic layer, the interface between said first antiferromagnetic layer and said first fixed magnetization layer, the interface between said first fixed magnetization layer and said first nonmagnetic conductive layer, and the interface between said free magnetization layer and said second nonmagnetic conductive layer is treated by plasma.

25. A method of production of a spin valve type giant magnetoresistive thin film as set forth in claim 24, wherein said first fixed magnetization layer is a first synthtic ferrimagnet structure comprised of a three-layer structure of a first fixed magnetization layer element, a first nonmagnetic layer, and a second fixed magnetization layer element; said second fixed magnetization layer is a second synthtic ferrimagnet structure comprised of a three-layer structure of a third fixed magnetization layer element, second nonmagnetic layer, and fourth fixed magnetization layer element; and at least one location in the interface between said first antiferromagnetic layer and said first fixed magnetization layer element, the interface between said first fixed magnetization layer element and said first nonmagnetic layer, the interface between said first nonmagnetic layer and said second fixed magnetization layer element, the interface between said second fixed magnetization layer element and said first nonmagnetic conductive layer, the interface between said third fixed magnetization layer element and said second nonmagnetic layer, and the interface between said second nonmagnetic layer and said fourth fixed magnetization layer element is treated by plasma.

26. A method of production of a spin valve type giant magnetoresistive thin film as set forth in claim 24, wherein said buffer layer is a multilayer film comprised of at least two types of layers and at least one location in any plurality of interfaces existing in said buffer layer is treated by plasma.

27. A method of production of a spin valve type giant magnetoresistive thin film as set forth in claim 24, wherein said plasma treatment uses plasma using a 13.56 MHz RE wave in a gas atmosphere of any of 0.01 to 100 Pa low pressure inert gas of Ar, Kr, Xe, Ne, or a gas resembling the same and an electrode structure is a type of parallel plate and capacitively-coupled.

28. A method of production of a spin valve type giant magnetoresistive thin film as set forth in claim 27, wherein, in said electrode structure, the substrate to be treated by plasma is arranged on an electrode provided with said RF wave, the power by said RF wave is not more than 0.5 W/cm$^2$ per unit area, and a bias voltage applied to the substrate is in a range of less than 0V and at least −300V.

29. A method of production of a spin valve type giant magnetoresistive thin film as set forth in claim 27, wherein the time of said plasma treatment is not more than one minute.

30. A method of production of a spin valve type giant magnetoresistive thin film as set forth in claim 24, wherein said plasma treatment is performed using ion bombardment based on an ion irradiation structure.

31. A method of production of a TMR film comprised of a buffer layer deposited on a substrate, a multilayer part including an aluminum oxide layer, a fixed magnetization layer and a free magnetization layer sandwiching said aluminum oxide layer and an antiferromagnetic layer formed adjoining said fixed magnetization layer, and a protective layer deposited at a topmost position, wherein at least one location in the plurality of interfaces formed between said aluminum oxide layer and said buffer layer is treated by plasma.

* * * * *